United States Patent
Wu et al.

(10) Patent No.: US 11,848,332 B2
(45) Date of Patent: Dec. 19, 2023

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Gao-Ming Wu, Hsinchu (TW); Katherine H. Chiang, New Taipei (TW); Chien-Hao Huang, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 182 days.

(21) Appl. No.: 17/383,444

(22) Filed: Jul. 23, 2021

(65) Prior Publication Data
US 2023/0028561 A1    Jan. 26, 2023

(51) Int. Cl.
| H01L 21/00 | (2006.01) |
| H01L 27/12 | (2006.01) |
| H01L 29/00 | (2006.01) |
| H01L 29/66 | (2006.01) |
| H01L 21/02 | (2006.01) |
| H01L 29/786 | (2006.01) |

(52) U.S. Cl.
CPC ...... *H01L 27/124* (2013.01); *H01L 21/02565* (2013.01); *H01L 27/127* (2013.01); *H01L 27/1225* (2013.01); *H01L 29/66969* (2013.01); *H01L 29/7869* (2013.01)

(58) Field of Classification Search
CPC ......... H01L 21/02565; H01L 21/76807; H01L 21/7686; H01L 21/0271; H01L 27/124; H01L 27/1225; H01L 27/127; H01L 29/66969; H01L 29/7869; H01L 29/78696; H01L 29/66439; H01L 21/3144; H01L 21/76873; H01L 21/78831
See application file for complete search history.

(56) References Cited

U.S. PATENT DOCUMENTS

| 8,372,720 B2 * | 2/2013 | Fukuzumi | ............ H10B 43/20 257/326 |
| 2010/0207195 A1 * | 8/2010 | Fukuzumi | .......... G11C 16/0483 257/326 |

* cited by examiner

*Primary Examiner* — Nikolay K Yushin
(74) *Attorney, Agent, or Firm* — JCIPRNET

(57) ABSTRACT

A semiconductor die includes a semiconductor substrate and a transistor array disposed over the semiconductor substrate. The transistor array includes unit cells and spacers. The unit cells are disposed along rows of the transistor array extending in a first direction and columns of the transistor array extending in a second direction perpendicular to the first direction. The spacers encircle the unit cells. The unit cells include source contacts and drain contacts separated by interlayer dielectric material portions. First sections of the spacers contacting the interlayer dielectric material portions are thicker than second sections of the spacers contacting the source contacts and the drain contacts.

20 Claims, 20 Drawing Sheets

SEMICONDUCTOR DEVICE AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
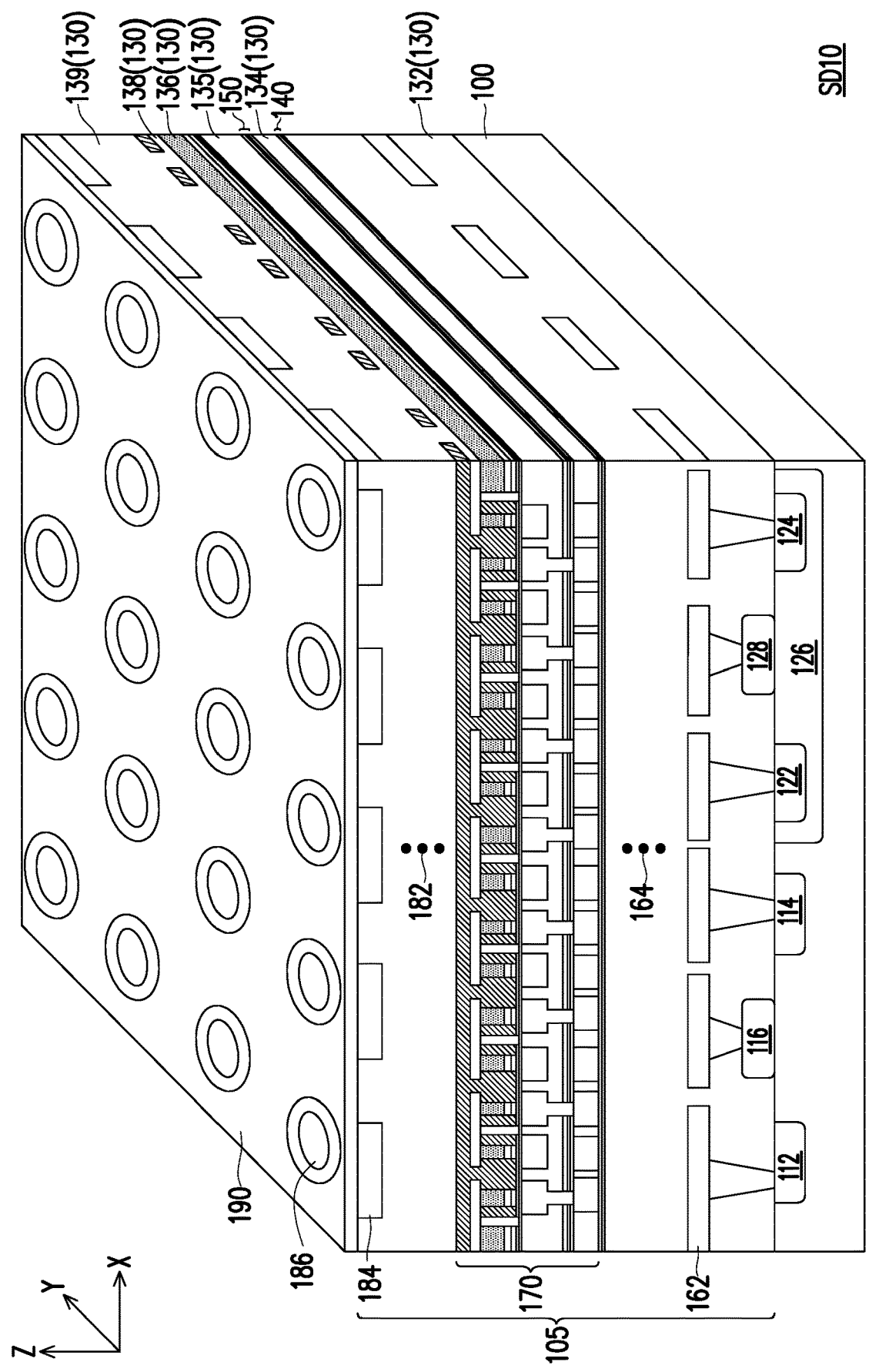
FIG. 1 is a schematic perspective view of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
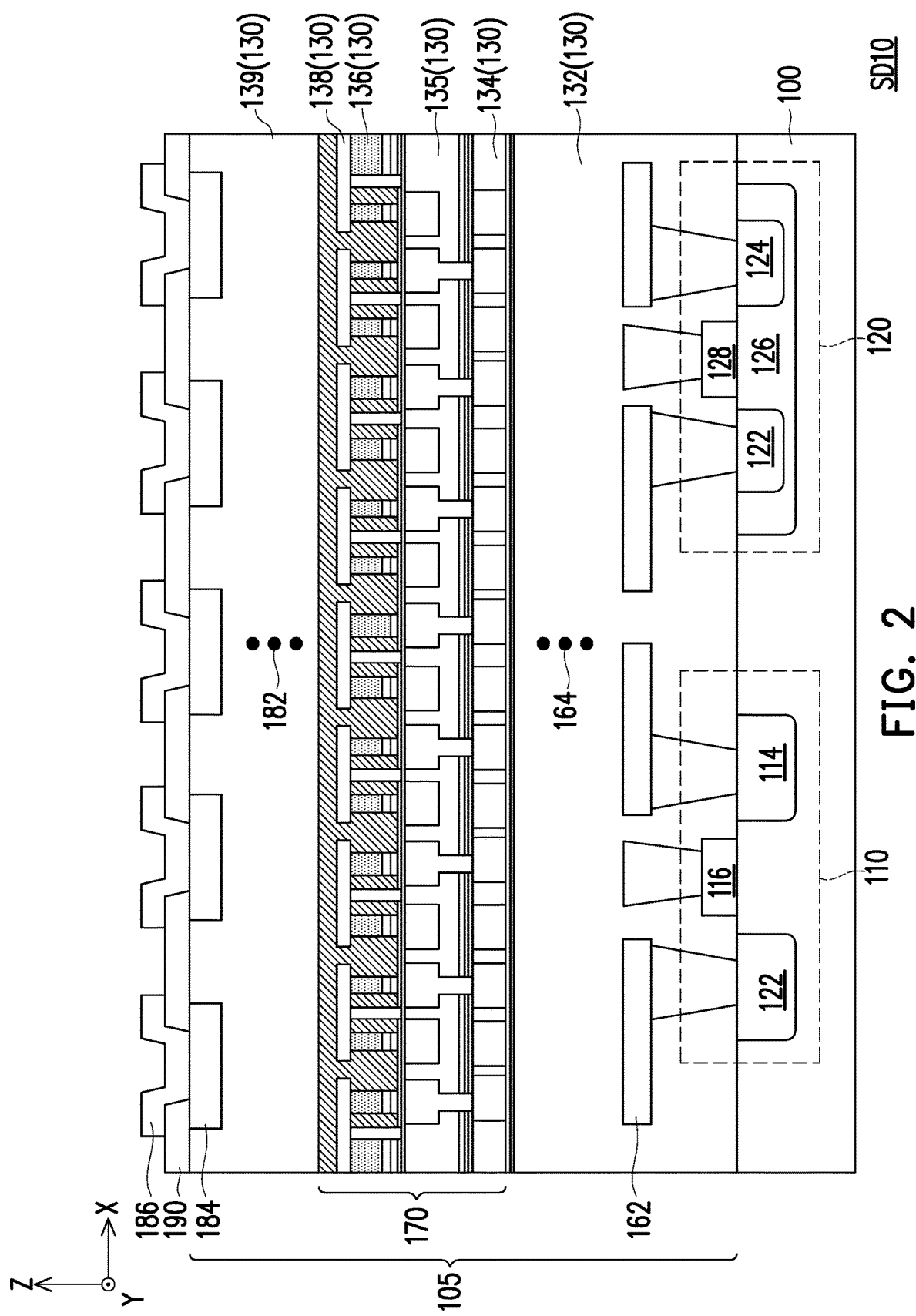
FIG. 2 is a schematic cross-sectional view of a semiconductor device according to some embodiments of the disclosure.

FIG. 1 is a schematic perspective view of a semiconductor device SD10 according to some embodiments of the disclosure. FIG. 2 is a schematic cross-sectional view of the semiconductor device SD10 according to some embodiments of the disclosure. The view of FIG. 2 may be taken in an XZ plane, where the X, Y, and Z directions form a set of orthogonal Cartesian coordinates. In some embodiments, the semiconductor device SD10 includes a semiconductor substrate 100 and an interconnection structure 105 formed on the semiconductor substrate 100. In some embodiments, the semiconductor substrate 100 includes one or more semiconductor materials, which may be elemental semiconductor materials, compound semiconductor materials, or semiconductor alloys. For instance, the elemental semiconductor material may include Si or Ge. The compound semiconductor materials and the semiconductor alloys may respectively include SiGe, SiC, SiGeC, a III-V semiconductor, a II-VI semiconductor, or semiconductor oxide materials. For example, the semiconductor oxide materials may be one or more of ternary or higher (e.g., quaternary and so on) semiconductor oxides, such as indium gallium zinc oxide (IGZO), indium zinc oxide (IZO), or indium tin oxide (ITO). In some embodiments, the semiconductor substrate 100 may be a semiconductor-on-insulator, including at least one layer of dielectric material (e.g., a buried oxide layer) disposed between a pair of semiconductor layers.

FIG. 1 and FIG. 2 further illustrate functional circuits that may be formed over the semiconductor substrate 100. For example, a transistor 110 and a transistor 120 are illustrated on the semiconductor substrate 100. The transistor 110 may include a pair of source and drain regions 112, 114 embedded in the semiconductor substrate 100, separated from each other by a portion of semiconductor substrate 100 which functions as a channel region of the transistor 110. A gate structure 116 is disposed on the channel region in between the source and drain regions 112, 114. In some embodiments, the source and drain regions 112, 114 may be doped, for example with n-type materials or p-type materials. In some embodiments, the transistor 120 may also include a pair of source and drain regions 122, 124, which may be optionally doped with n-type materials or p-type materials. In some embodiments, the source and drain regions 122, 124 are doped with materials of opposite conductivity type with respect to the source and drain regions 112, 114. In some embodiments, the source and drain regions 122, 124 may be embedded in a region 126 of different composition. For example, the region 126 may be doped with a material of opposite conductivity type with respect to the source and drain regions 122, 124, or the region 126 may include a same dopant as the source and drain regions 122, 124, but in different concentration. For example, the source and drain regions 122, 124 may be doped with a p-type material, and the region 126 may be doped with an n-type material. In some embodiments, a gate structure 128 is disposed on the region 126 in between the source and drain regions 122, 124.

It should be noted that the disclosure does not limit the architecture of the transistors 110, 120. For example, the transistors 110, 120 may be planar field effect transistors, fin field effect transistors, gate all around transistors, or any other transistor architecture. Furthermore, different gate contact schemes, such as front-gate, back-gate, double-gate, staggered, etc., are contemplated within the scope of the disclosure. Although in FIGS. 1 and 2 are illustrated transistors 110, 120 formed over the semiconductor substrate 100, other active devices (e.g., diodes or the like) and/or passive devices (e.g., capacitors, resistors, or the like) may also be formed as part of the functional circuit.

The interconnection structure 105 may be formed over the semiconductor substrate 100 to integrate the circuit devices formed on the semiconductor substrate 100 in one or more functional circuits. For example, the interconnection structure 105 may include an interlayer dielectric 130 in which are embedded metallization layers that interconnect the circuit devices with each other. It should be noted that the interlayer dielectric 130 may be shown as a single layer for simplicity, but, in practice, it may be constituted by multiple interlayer dielectric layers (e.g., 132, 134, 135, 136, 138, 139) stacked on each other and possibly containing different materials. The disclosure does not limit the number of interlayer dielectric layers included in the interlayer dielectric 130, and the number illustrated in the drawings is but one example. Additional layers such as barrier layers, etch stop layers 140, 150, etc., may also be formed in between the interlayer dielectric layers 132, 134, 135, 136 138, 139. The interlayer dielectric 130 may be formed on the semiconductor substrate 100, extending on the transistors 110, 120 and on other circuit devices which may be formed on the semiconductor substrate 100. Each metallization layer (e.g., the bottommost metallization layer 162) may include conductive patterns and interconnect vias extending through the interlayer dielectric 130 to electrically couple to the circuit devices formed on the semiconductor substrate 100, for example to couple to the source/drain regions 112, 114, 122, 124 and to the gate structures 116, 128 of the transistors 110, 120. In some embodiments, one or more additional metallization layers 164 (schematically represented as dots in FIG. 1 and FIG. 2) are formed over the semiconductor substrate 100. In some embodiments, the functional circuits formed by the interconnection structure 105 may comprise logic circuits, memory circuits, sense amplifiers, controllers, input/output circuits, image sensor circuits, the like, or combinations thereof. The disclosure does not limit the number of additional metallization layers 164 formed in an interconnection structure 105, which may be adapted according to routing and design requirements.

In some embodiments, the interlayer dielectric 130 of the interconnection structure 105 may include low-k dielectric materials. Examples of low-k dielectric materials include Xerogel, Aerogel, amorphous fluorinated carbon, parylene, BCB (bis-benzocyclobutenes), flare, hydrogen silsesquioxane (HSQ), fluorinated silicon oxide (SiOF), or a combination thereof. In some embodiments, the individual interlayer dielectric layers 132, 134, 135, 136, 138, 139 of the interlayer dielectric 130 may be fabricated to a suitable thickness by flowable CVD (FCVD), CVD, HDPCVD, SACVD, spin-on, sputtering, or other suitable methods. In some embodiments, the metallization layers (e.g., 140, 150) may include cobalt (Co), tungsten (W), copper (Cu), titanium (Ti), tantalum (Ta), aluminum (Al), zirconium (Zr), hafnium (Hf), a combination thereof, or other suitable metallic materials, and may be fabricated through a sequence of deposition (e.g., CVD, PVD, ALD), plating, or other suitable material-forming processes, and planarization steps (e.g., chemical mechanical polishing). In some embodiments, the interconnection structure 105 may be formed via damascene, dual damascene, or other suitable processes.

In some embodiments, in correspondence of one or more of the metallization layers of the interconnection structure 105, is formed a transistor array 170. The transistor array 170 may be over the semiconductor substrate 100 embedded in the interconnection structure 105, for example formed on one of the lower metallization layers 164. Additional metallization layers 182 and conductive patterns 184 may be formed over the transistor array 170, to further integrate the transistor array 170 with the remaining circuitry of the semiconductor device SD10, and to bring signals generated or processed by the semiconductor device SD10 towards an I/O interface. For example, the conductive patterns 184 may be formed as the topmost metallization level, at the top of the interlayer dielectric 130 (e.g., in the uppermost interlayer dielectric layer 139, at the side of the interlayer dielectric 130 further away from the semiconductor substrate 100). Contact pads 186 may be formed to land on the conductive patterns 184, and to act as I/O interfaces to integrate the semiconductor device SD10 into larger devices. A passivation layer 190 may be disposed on the interconnection structure 105. The passivation layer 190 may include a dielectric material, and may protect the underlying components of the semiconductor device SD10.

As illustrated by the above examples, in some embodiments, the semiconductor device SD10 may be a semiconductor die. In some embodiments, the semiconductor device SD10 may be integrated in larger semiconductor devices, for example by connecting the contact pads 186 to interposers, circuit substrates, or the like.

Figure 3:
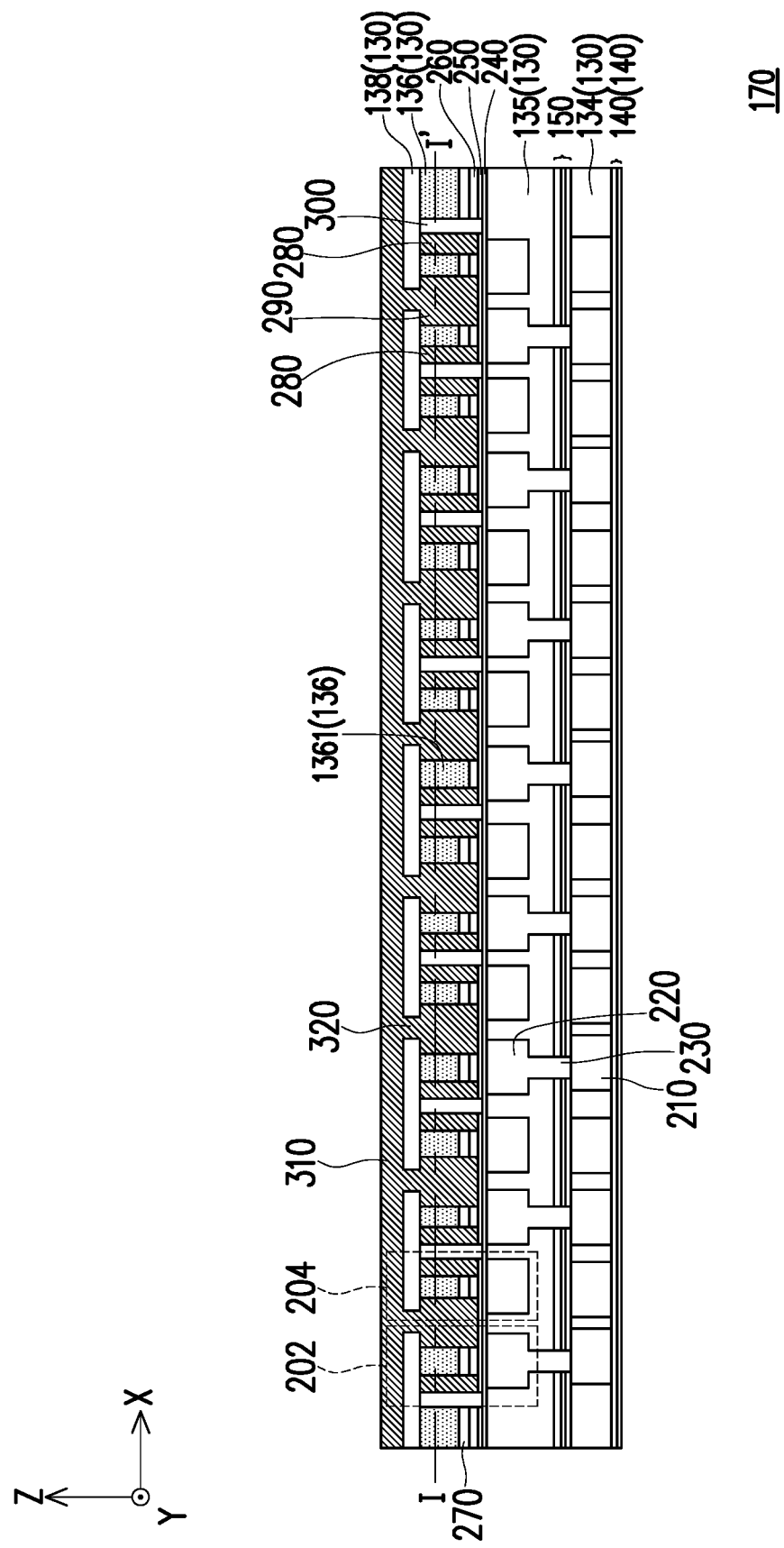
FIG. 3 is a schematic cross-sectional view of a region of a semiconductor device according to some embodiments of the disclosure.
Figure 4A:
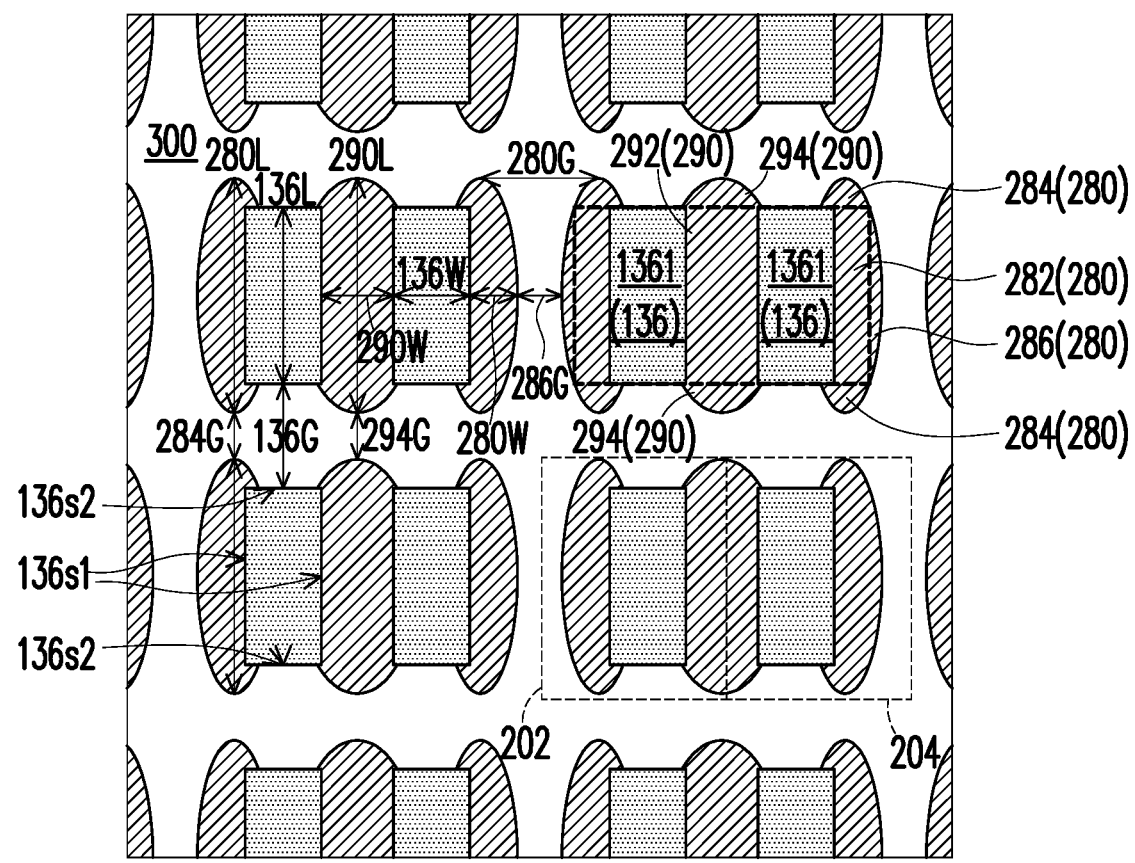
FIG. 4A is a schematic cross-sectional view of a region of a semiconductor device according to some embodiments of the disclosure.
Figure 4B:
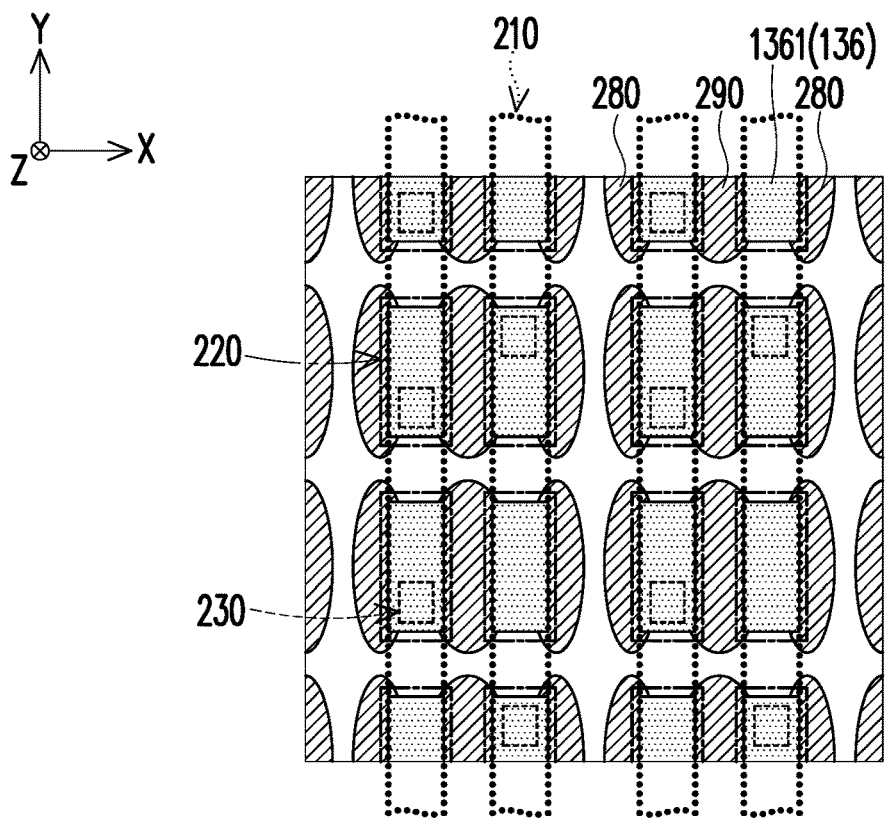
FIG. 4B is a schematic bottom view of a region of a semiconductor device according to some embodiments of the disclosure.
Figure 4C:
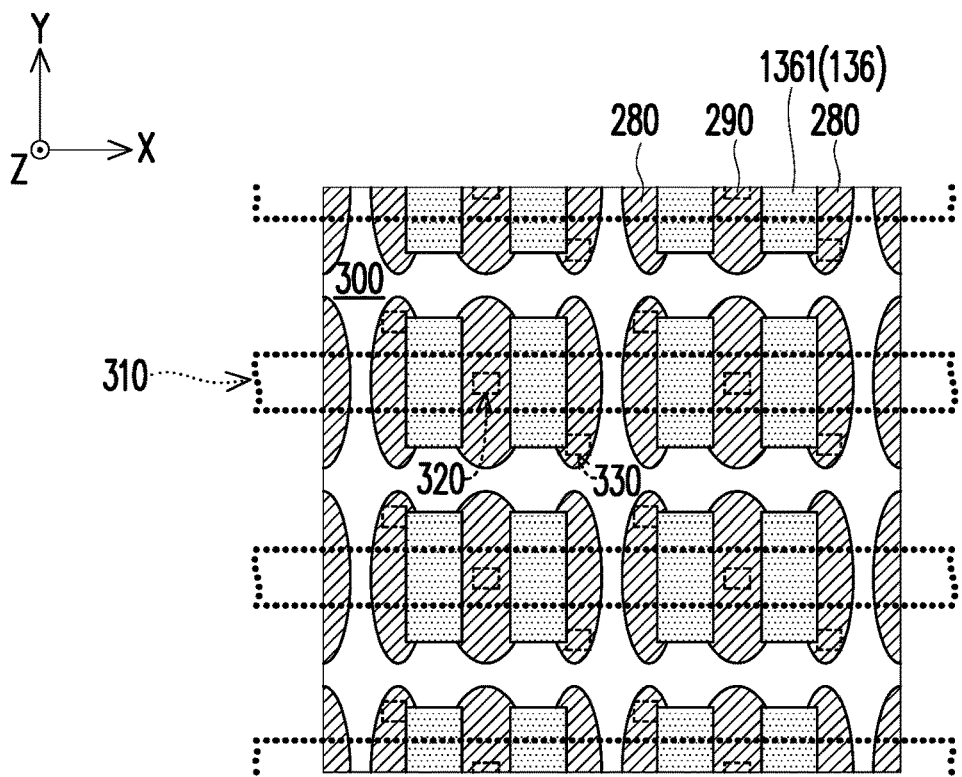
FIG. 4C is a schematic top view of a region of a semiconductor device according to some embodiments of the disclosure.

FIG. 3 is a schematic cross-sectional view of the transistor array 170 according to some embodiments of the disclosure. FIG. 4A is a schematic cross-sectional view of a region of the transistor array 170 according to some embodiments of the disclosure. The view of FIG. 4A may be taken at the level height of the line I-I' illustrated in FIG. 3. FIG. 4B is a schematic bottom view of the same region illustrated in FIG. 4A according to some embodiments of the disclosure. The view of FIG. 4B corresponds to the view of FIG. 4A, with added the footprints of some elements disposed along the negative Z direction with respect to the plane of view of FIG. 4A (e.g., moving towards the semiconductor substrate 100 illustrated in FIG. 1). FIG. 4C is a schematic top view of the same region illustrated in FIG. 4A according to some embodiments of the disclosure. The view of FIG. 4C corresponds to the view of FIG. 4A, with added the footprints of some elements disposed along the positive Z direction with respect to the plane of view of FIG. 4A (e.g., moving away from the semiconductor substrate 100 illustrated in FIG. 1). Referring to FIG. 1 to FIG. 4C, in some embodiments, the transistor array 170 includes a plurality of unit cells 202, 204 disposed in an array manner, in rows and columns extending along orthogonal directions (e.g., the X and Y directions in FIG. 4). Each unit cell 202, 204 may include at least one transistor. The transistor array 170 may include conductive lines 210 which extend parallel to each other along one of the two directions of the array of unit cells 202, 204 (e.g., the Y direction) and are distributed along the other direction of the array of unit cells 202, 204 (e.g., X direction). The conductive lines 210 may be embedded in an interlayer dielectric layer 134 of the interlayer dielectric 130. In some embodiments, the conductive lines 210 and the interlayer dielectric layer 134 are formed on an etch stop layer 140. The etch stop layer 140 may include one or more layers of materials having adequate etching selectivity with respect to the material of the interlayer dielectric layer 134. For example, the etch stop layer 140 may include a layer comprising a nitride (e.g., silicon nitride), a layer comprising an oxide (e.g., aluminum oxide), at least one each of said layers or layers including other suitable materials, or the like.

In some embodiments, each conductive line 210 extends below a line (e.g., a column) of unit cells 202, 204 of the array, and is connected to the unit cells 202, 204 of such line. That is, unit cells 202 formed at a same level height along the X direction may be connected to a same conductive line 210, while unit cells 202, 204 formed at different level heights along the X direction may be connected to different conductive lines 210. More specifically, each unit cell 202, 204 may include a gate pattern 220 which is connected by a contact via 230 to one of the conductive lines 210. Individual gate patterns 220 may be dedicated to individual cells 202, 204. The gate patterns 220 may be formed in an interlayer dielectric layer 135 of the interlayer dielectric 130 stacked on the interlayer dielectric layer 134 in which the conductive lines 210 are formed. An etch stop layer 150 may be disposed between the interlayer dielectric layer 134 and the interlayer dielectric layer 135. The etch stop layer 150 may have a similar structure and include similar materials as previously described for the etch stop layer 140. The contact vias 230 may extend from the gate patterns 220 through the interlayer dielectric layer 135 and the etch stop layer 150 to contact the conductive lines 210. In some embodiments, the gate patterns 220 may include any suitable metallic material, such as cobalt (Co), copper (Cu), titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), a combination thereof, or the like.

A gate dielectric layer 240 may be disposed on the array of gate patterns 220, blanketly covering the gate patterns 220 and the interlayer dielectric layer 135. In some embodiments, the gate dielectric layer 240 includes a material with a dielectric constant greater than about 4, greater than about 12, greater than about 16, or even greater than about 20. For example, a material of the gate dielectric layer 240 may include a metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HMO, a silicate such as HfSiO, HfSiON, LaSiO, AlSiO, a combination thereof, or other suitable materials. The gate dielectric layer 240 may have a substantially uniform thickness along the Z direction, for example in the range up to about 200 angstroms.

On the gate dielectric layer 240 may be sequentially stacked a semiconductor channel layer 250, a cap layer 260, and a hard mask layer 270. The semiconductor channel layer 250 may include an oxide material having semiconducting character, and suitable to function as channel for the transistors of the transistor array 170. For example, the semiconductor oxide materials may be metal oxide materials including one or more of In, Zn, G, Sn, Pb, Zr, Sr, Ru, Mn, Mg, Nb, Ta, Hf, Al, La, Sc, Ti, V, Cr, Mo, W, Fe, Co, Ni, Pd, Ir, Ag, or combination thereof. Some elements may be present as dopant of other metal oxides. In some embodiments, the semiconductor oxide material may be ternary or higher (e.g., quaternary and so on) semiconductor oxides, such as indium gallium zinc oxide (IGZO), indium zinc oxide (IZO), or indium tin oxide (ITO). In some embodiments, a thickness of the semiconductor channel layer 250 along the Z direction may be in the range up to about 300 angstroms.

In some embodiments, the cap layer 260 is disposed on the semiconductor channel layer 250. In some embodiments, the cap layer 260 includes a material having etching selectivity with respect to the semiconductor channel layer 250. For example, the cap layer 260 may include an oxide such as silicon oxide, and may be formed with a thickness along the Z direction in the range up to about 500 angstroms. The hard mask layer 270 is disposed on the cap layer 260, and may include a material having etching selectivity with respect to the cap layer 260. In some embodiments, the hard mask layer 270 may include a nitride, such as silicon nitride, an oxide, such as aluminum oxide, a combination thereof, or the like. In some embodiments, a thickness along the Z direction of the hard mask layer 270 may be in the range up to about 500 angstroms.

In some embodiments, the unit cells 202, 204 include source contacts 280 and drain contacts 290. The source contacts 280 and the drain contacts 290 may be at least partially embedded in an interlayer dielectric layer 136, which interlayer dielectric layer 136 extends on the hard mask layer 270. Furthermore, in some embodiments, the source contacts 280 and the drain contacts 290 extend through the hard mask layer 270 and the cap layer 260 to land on the semiconductor channel layer 250. That is, the source contact 280 and the drain contact 290 may directly contact the semiconductor channel layer 250. In some embodiments, each unit cell 202, 204 may include a dedicated source contact 280, while the drain contacts 290 may be shared between adjacent unit cells 202, 204. For example, two source contacts 280 of adjacent unit cells 202, 204 may be disposed at opposite sides (e.g., along the X direction) of a same drain contact 290, separated from the shared drain contact 290 by portions 1361 of the interlayer dielectric layer 136. The two unit cells 202, 204 sharing the same drain contact 290 may belong to a same row of the transistor array 170 (e.g., may be located at the same level height along the Y direction), so as to be connected to different conductive lines 210. Gate patterns 220 of each unit cell 202, 204 may extend at the opposite side of the semiconductor channel layer 250 with respect to the portions 1361 of interlayer dielectric layer 136 separating the source contacts 280 from the drain contacts 290. Upon application of an adequate voltage to the gate pattern 220 by the corresponding conductive line 210, current would flow through the semiconductor channel layer 250 from the source contact 280 to the drain contact 290 of the unit cell 202, 204 to which the gate pattern 220 belongs. Therefore, unit cells 202, 204 sharing the same drain contact 290 may be selectively addressed by applying voltage to the associated conductive lines 210. In some embodiments, the conductive material of the source contacts 280 and drain contacts 290 includes cobalt (Co), tungsten (W), copper (Cu), titanium (Ti), tantalum (Ta), aluminum (Al), zirconium (Zr), hafnium (Hf), a combination thereof, or other suitable metallic materials. In some embodiments, the conductive material may be provided on one or more seed layers, barrier layers, etc. (not shown). That is, the source contacts 280 and the drain contacts 290 may include one or more seed layers, barrier layers, etc.

In some embodiments, pairs of unit cells 202, 204 sharing the same drain contact 290 are encircled by spacers 300. The spacers 300 may form a meshed structure, with meshes laterally surrounding the pairs of unit cells 202, 204. In particular, parts of the spacers 300 may extend along a first direction (e.g., the Y direction) covering outer side surfaces of the source contacts 280 opposite to the portions 1361 of interlayer dielectric layer 136 separating the source contacts 280 from the common drain contact 280. Such parts may then be joined together by additional parts of the spacers 300 extending along a perpendicular direction (e.g., the X direction) to cover other outer side surfaces of the source contacts 280, the drain contacts 290 and the intervening portions 1361 of interlayer dielectric layer 136. The spacers 300 may be also partially embedded in the interlayer dielectric layer 136, and may further extend through the hard mask layer 270, the cap layer 260, and the semiconductor channel layer 250. In some embodiments, the spacers 300 land on the gate dielectric layer 240, so that each pair of unit cells 202, 204 includes a separate portion of the semiconductor channel layer 250. In some embodiments, the spacers 300 may include any suitable dielectric material, such as oxides, nitrides, carbides, oxynitrides, or the like. In some embodiments, the material of the spacers 300 may be selected so as to further perform a barrier function. For example, when the spacers 300 include diffusion barrier materials such as aluminum oxide, the spacers 300 may protect the material of the semiconductor channel layer 250 from diffused H or O atoms, thus reducing instability and enhancing the reliability of the semiconductor device SD10.

In some embodiments, another interlayer dielectric layer 138 is formed on the interlayer dielectric layer 136, extending over the spacers 300 and over at least portions of the source contacts 280 and the drain contacts 290. Conductive lines 310 may be embedded in the interlayer dielectric layer 138. The conductive lines 310 may extend parallel to each other along the other direction of the array with respect to the extending direction of the conductive lines 210. That is, the conductive lines 310 may extend perpendicularly with respect to the conductive lines 210. So, for example, if the conductive lines 210 extend along the column direction (e.g., the Y direction) of the transistor array 170, the conductive lines 310 may extend along the row direction (e.g., the X direction) of the transistor array 170. Furthermore, the conductive lines 310 are spaced from each other within the interlayer dielectric layer 138 along the extending direction of the conductive lines 210 (e.g., along the Y direction). The conductive lines 310 are connected to the drain contacts 290 by contact vias 320 extending through the interlayer dielectric layer 138. In particular, the conductive lines 310 may extend over lines (e.g., rows) of unit cells 202, 204 of the transistor array 170, so that unit cells 202, 204 formed at a same level height along the Y direction are connected to the same conductive line 310, and unit cells 202, 204 formed at different level heights along the Y direction are connected to different conductive lines 310. In other words, the conductive lines 210 and 310 extend perpendicular with respect to each other, and the unit cells 202, 204 are located in correspondence of the intersection points of the extending directions of the conductive lines 210 and 310, so that any individual unit cell 202, 204 may be selected by the combination of associated conductive lines 210 and 310. In some embodiments, the conductive lines 310 and the contact vias 320 include cobalt (Co), tungsten (W), copper (Cu), titanium (Ti), tantalum (Ta), aluminum (Al), zirconium (Zr), hafnium (Hf), a combination thereof, or other suitable metallic materials.

Referring to FIG. 3 and FIG. 4A to FIG. 4C, in some embodiments, the portions 1361 of interlayer dielectric layer 136 separating the source contacts 280 and the drain contacts 290 may have a substantially square or rectangular footprint when viewed in cross-sections transversal with respect to the Z direction, such as in XY planes. For example, such portions 1361 of interlayer dielectric layer 136 may have a pair of side surfaces $136s1$ extending along one of the two directions of the transistor array 170 (e.g., the Y direction) which contact the source contacts 280 and the drain contacts 290. The side surfaces $136s1$ are joined together by another pair of side surfaces $136s2$ extending along the other one of the two directions of the transistor array 170 (e.g., the X direction) and contacting the spacers 300. The portion of interlayer dielectric layer 136 may have an overall rectangular footprint, for example with an aspect ratio of the size 136L along the Y direction to the size 136W along the X direction in the range between 0.1 to 20. For example, the size 136L along the Y direction may be about in the range from 10 angstroms to 200 angstroms, and the size 136W along the X direction may be about in the range from 10 angstroms to 100 angstroms, however the disclosure is not limited thereto.

The gate patterns 220 may overlap with the portions 1361 of interlayer dielectric layer 136 of the corresponding unit cells 202, 204, and the conductive lines 210 may overlap with multiple gate patterns 220 aligned along the X direction. In FIG. 4B are also shown the footprints of the contact vias 230 joining the gate patterns 220 to the conductive lines 210. In some embodiments, the contact vias 230 of adjacent (along the X direction) unit cells 202, 204 sharing a same drain contact 290 may be formed at different level heights along the Y direction, but the disclosure is not limited thereto.

In some embodiments, the source contacts 280 and the drain contacts 290 may protrude into the spacers 300 with respect to the portions 1361 of interlayer dielectric layer 136. That is, the outer side surfaces of the source contacts 280 and the drain contacts 290 in contact with the spacers 300 may be substantially straight along the Z direction, while may present some curvature along the X and/or Y direction. For example, from what could be considered core regions 282 of the source contacts 280, convexities 284 may protrude into the spacers 300 along the Y direction with respect to the side surfaces 136s2 of the portions 136l of interlayer dielectric layer 136. The convexities 284 may be formed at both sides of the core region 282 with respect to the Y direction. Furthermore, a convexity 286 may protrude from the core region 282 into the spacers 300 along the X direction, at an opposite side of the core region 282 with respect to the portion of interlayer dielectric layer 136. As a way of example, the size 280L of the source contacts 280 along the Y direction (measured as the distance between the peaks of the convexity 284) may be up to about 1.5 times the size 136L of the adjacent portion of interlayer dielectric layer 136. For example, the ratio of the size 280L to the size 136L may be about in the range from 1 to 1.5. In some embodiments, the size 280L may be about in the range from 10 angstroms to 300 angstroms, however the disclosure is not limited thereto. In some embodiments, the source contacts 280 may have a slightly elongated shape along the Y direction. For example, the size 280W along the X direction may be about in the range from 10 angstroms to 100 angstroms.

Similarly, the drain contacts 290 may be considered to include core regions 292 delimited along the X direction by the interlayer dielectric layer 136, and convexities 294 protruding into the spacers 300 at opposite sides of the core regions 292 along the Y direction. The size 290L of the drain contacts 290 along the Y direction (measured as the distance between the peaks of the convexities 294) may be in a similar range as previously described for the size 280L of the source contact 280. In some embodiments, the size 290L of the drain contacts 290 may be substantially equal to the size 280L of the source contacts 280. For example, the ratio of the size 290L to the size 136L may be about in the range from 1 to 1.5. In some embodiments, the drain contacts 290 may be slightly wider along the X direction than the source contacts 280, for example with a size 290W along the X direction about in the range from 10 angstroms to 200 angstroms.

In some embodiments, the contact vias 320 connecting the drain contacts 290 to the conductive lines 310 may land in correspondence of the core regions 292, while the contact vias 330 connected to the source contacts 280 may land on the convexities 284. For example, for a pair of unit cells 202, 204 sharing the same drain contact 290, the contact vias 330 contacting the source contacts 280 may be disposed at opposite sides of the conductive line 310 along the Y direction. However, the disclosure is not limited thereto, and other configurations are possible. For example, the conductive line 310 may overlay the convexities 294, so that the contact via 320 lands on the convexities 294, while one or both of the contact vias 330 land on the core regions 282.

In some embodiments, the spacers 300 present regions of varying thickness, where the thickness of the spacer may be measured as the distance (gap) between facing elements along the X and/or Y direction, for example. For example, the gap 136G between portions 136l of interlayer dielectric layer 136 belonging to unit cells 202, 204 consecutively aligned along the Y direction may be larger than the gaps 284G or 294G between the facing convexities 284, 294 of the source contacts 280 and the drain contacts 294 (where the gaps 284G, 294G may be measured in correspondence of the peaks of the convexities 284, 294) of the same unit cells 202, 204. For example, the gaps 284G, 294G may independently be about in the range from 5 angstroms to 1000 angstroms, and the gaps 136G may be about in the range from 10 angstroms to 1000 angstroms, so that the ratio of the gap 284G or 294G to the hap 136G may be about in the range from 0.5 to 1. That is, along the Y direction, the spacers 300 may be thicker in correspondence of the portions 136l of interlayer dielectric layer 136 and may be thinner in correspondence of the source contacts 280 and drain contacts 290. Similarly, the spacers may present regions of varying thickness along the X direction. For example, the gap 286G between facing convexities 286 of source contacts 280 belonging to consecutive unit cells 202, 204 along the X direction not sharing a common drain contact 290 may be smaller than the gap 280G between the peaks of the convexities 284 of the same source contacts 280. Both the gaps 286G and 280G may be measured along the X direction, in correspondence of the peaks of the convexities 286 and 284, respectively. For example, the gap 280G may be between about 1.1 to 2000 times the gap 286G. For example, the gap 286G between the peaks of convexities 286 may be about in the range from 5 angstroms to 1000 angstroms, and the gap 280G between the peaks of convexities 284 may be about in the range from 5.5 angstroms to 10000 angstroms.

It should be noted that while the above description presented the semiconductor device SD10 as including one transistor array 170 within the interconnection structure 105, the disclosure is not limited thereto. For example, in some embodiments, multiple transistor arrays 170 may be stacked on each other. Furthermore, while the conductive lines 210 were shown to contact the unit cells 202, 204 from the side of the semiconductor substrate 100, the disclosure is not limited thereto. In some embodiments, the conductive lines 210 may contact the unit cells 202, 204 from the opposite side with respect to the semiconductor substrate 100.

In some embodiments, the transistor array 170 may be configured as a memory array, with the conductive lines 210 acting a word lines, the conductive lines 310 acting as bit lines, and the unit cells 202, 204 corresponding to memory cells. For example, the source contacts 280 may be connected to suitable memory elements, so that the transistor array 170 may be configured as a dynamic random-access memory (DRAM), a high-density non-volatile memory such as a magneto-resistive random-access memory (MRAM), a resistive random-access memory (RRAM), a phase-change random-access memory (PCRAM), a conductive bridging random-access memory (CBRAM), or the like.

Figure 5A:
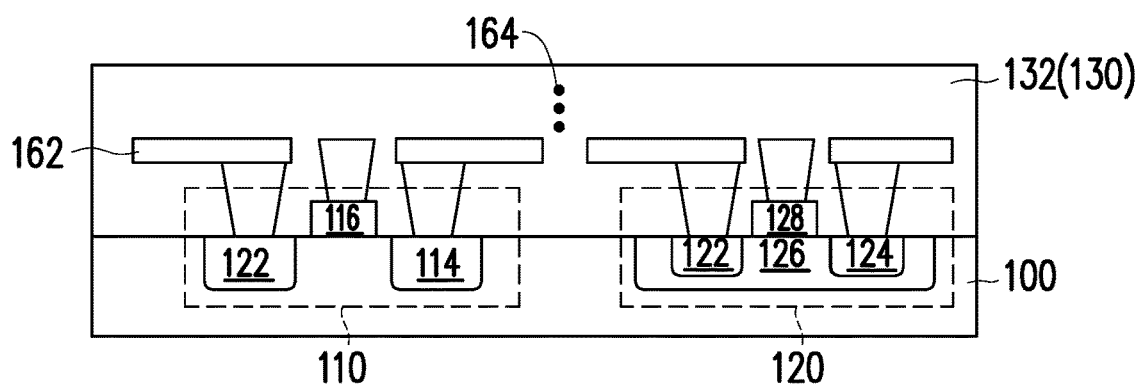
FIG. 5A to FIG. 5P are schematic cross-sectional views of a region of structures formed during a manufacturing method of a semiconductor device according to some embodiments of the disclosure.
Figure 5B:
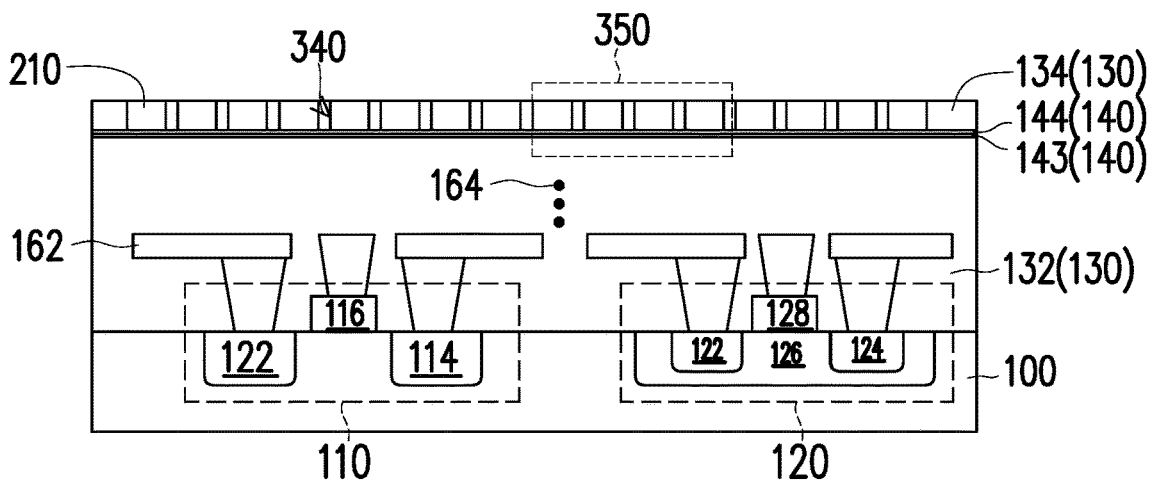

In the following, some aspects of a manufacturing method of the semiconductor device SD10 will be illustrated with reference to FIG. 5A to FIG. 5P. FIG. 5A and FIG. 5B are schematic cross-sectional views of a region of structures formed during a manufacturing method of the semiconductor device SD10 according to some embodiments of the disclosure. The views of FIG. 5C to FIG. 5P are schematic cross-sectional views of structures formed during a manufacturing method of the semiconductor device SD10 corresponding to a region where the transistor array 170 is formed, for example corresponding to the area 350 in FIG. 5B.

Referring to FIG. 5A, in some embodiments, the transistors 110, 120 are formed on the semiconductor substrate 100 during front-end-of-line processes. The source and drain regions 112, 114, 122, 124 may be formed according to any suitable process, such as epitaxial growth, ion implantation, etc. The gate structures 116, 128 may be formed according to any suitable process, for example by a gate replacement process employing dummy gate structures. The interlayer dielectric layer 132 may be blanketly formed over the semiconductor substrate 100, burying the source/drain regions 112, 114, 122, 124 and the dummy gate structures. The dummy gate structures may then be removed and the gate structures 116, 128 may be formed in place of the dummy gate structures. The lower metallization layers 162, 164 of the interconnection structure 105 (illustrated in FIG. 1) may then be formed in the interlayer dielectric layer 132, up to the level where the transistor array 170 is to be formed.

In FIG. 5B, the etch stop layer 140 is blanketly formed on the interlayer dielectric layer 132. For example, the etch stop layer 140 may be a composite etch stop layer, including multiple layers 143, 144 of different materials. The interlayer dielectric layer 134 may then be blanketly formed over the etch stop layer 140. The interlayer dielectric layer 134 may then be patterned to include openings 340 in correspondence of the intended locations of the conductive lines 210. For example, the openings 340 may be a series of parallel trenches elongated along the Y direction and disposed at a distance from each other along the Y direction. The openings may be filled by conductive material to form the conductive lines 210, for example by deposition, plating or the like. In some embodiments, the conductive material is formed so as to initially extend on the interlayer dielectric layer 134, and a planarization process (e.g., chemical mechanical polishing, grinding, or the like), is performed until the interlayer dielectric layer 134 is once again exposed, leaving the conductive lines 210 in the openings 340.

Figure 5C:
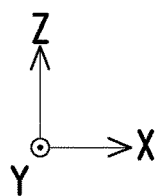
Figure 5C:
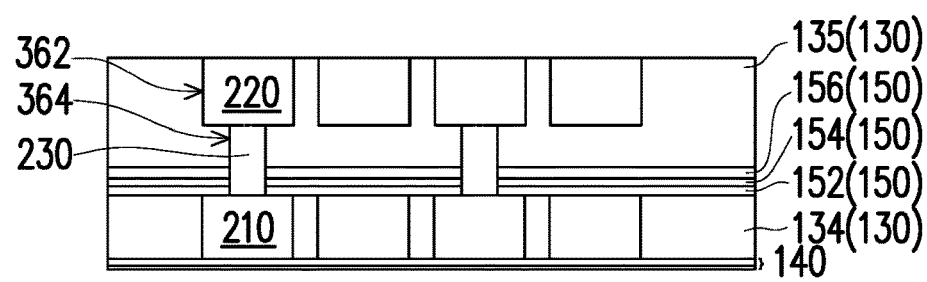

In FIG. 5C, the etch stop layer 150 is blanketly formed on the interlayer dielectric layer 134. In some embodiments, the etch stop layer 150 may be a composite etch stop layer, including multiple layers 152, 154, 156 of different materials. The interlayer dielectric layer 135 may be blanketly formed over the etch stop layer 150 and then patterned to include gate trenches 362 in correspondence of the intended locations of the gate patterns 220 and via trenches 364 in correspondence of the intended locations of the contact vias 230. The via trenches 364 may be extended through the etch stop layer 150 to expose regions of the underlying conductive lines 210, so that the gate patterns 220 may be connected to the conductive lines 210. The gate patterns 220 and contact vias 230 may be formed in the interlayer dielectric layer 135 according to any suitable process, such as damascene, dual damascene, or the like. In some embodiments, the gate trenches 362 and the via trenches 264 may be filled together by conductive material, for example by deposition, plating or the like. In some embodiments, the conductive material is formed so as to initially extend on the interlayer dielectric layer 135, and a planarization process (e.g., chemical mechanical polishing, grinding, or the like), is performed until the interlayer dielectric layer 135 is once again exposed.

Figure 5D:
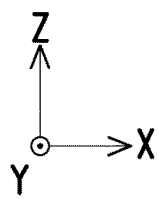
Figure 5D:
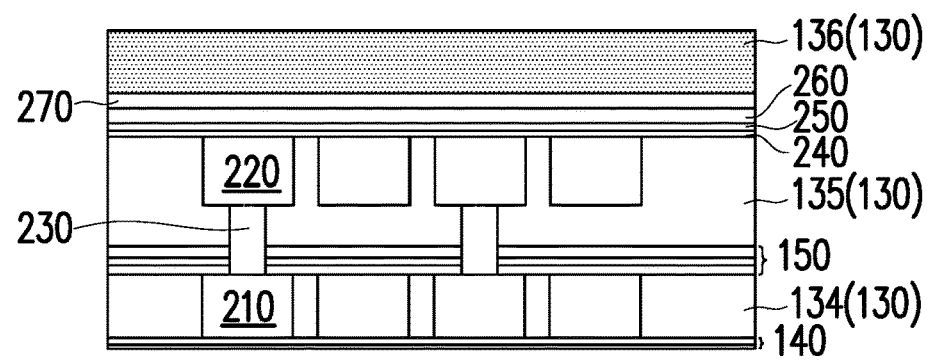

In FIG. 5D, the gate dielectric layer 240, the semiconductor channel layer 250, the cap layer 260, the hard mask layer 270, and the interlayer dielectric layer 136 are sequentially and blanketly formed over the interlayer dielectric layer 135 and the gate patterns 220. In some embodiments, the stacked layers 240, 250, 260, 270, 136 may be formed by a sequence of suitable processes to the desired thicknesses, such as deposition (CVD, PVD, ALD), spin-coating, or the like.

Figure 5E:
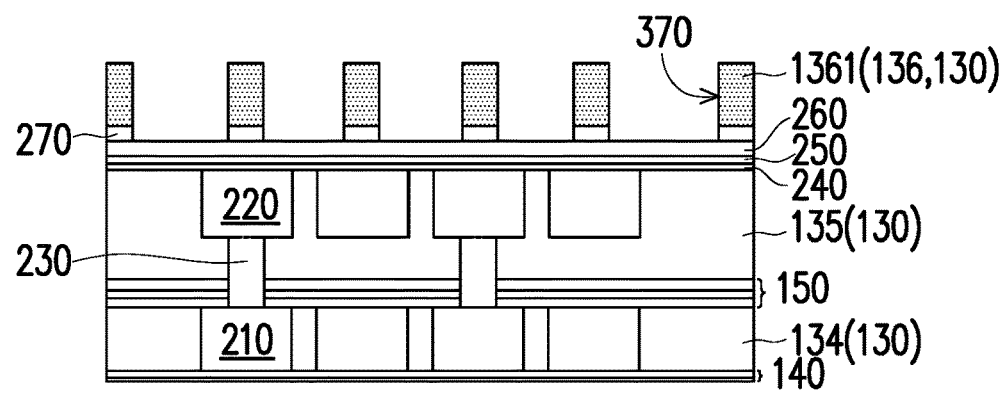

In FIG. 5E, the interlayer dielectric layer 136 and the hard mask layer 270 are patterned to form a contact trench 370 exposing at its bottom sections of the cap layer 260. In some embodiments, the contact trench 370 is formed by one or more etching steps. The etching may be any acceptable etch process, such as dry etching, plasma etching, ion beam etching (IBE), the like, or a combination thereof. In some embodiments, the etching may be anisotropic. In some embodiments, one or more auxiliary masks (not illustrated) may be employed to define the pattern of the interlayer dielectric layer 136 during a first etching step, which pattern is then transferred to the hard mask layer 270. In some embodiments, portions 1361 of the interlayer dielectric layer 136 may remain interspersed within the contact trench 370, which portions 1361 of interlayer dielectric layer 136 correspond to the separating structures between source contacts 280 and drain contacts 290 previously discussed with reference to FIG. 4A.

Figure 5F:
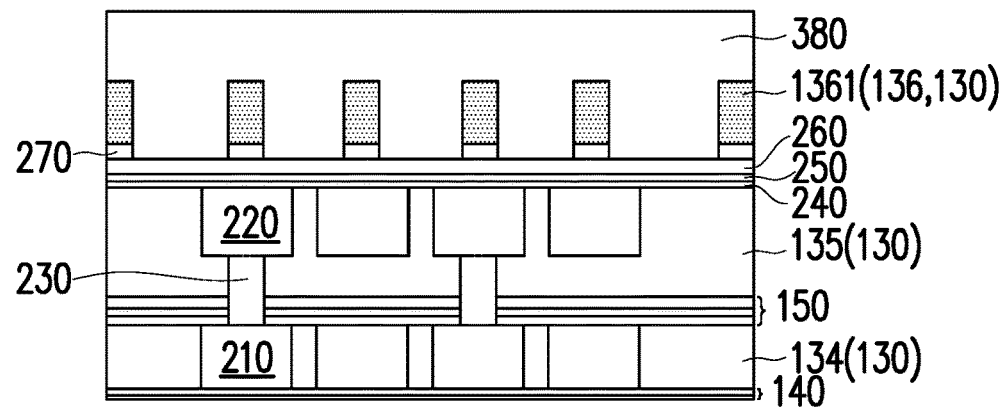
Figure 5G:
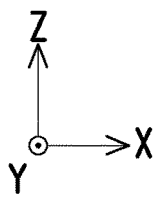
Figure 5G:
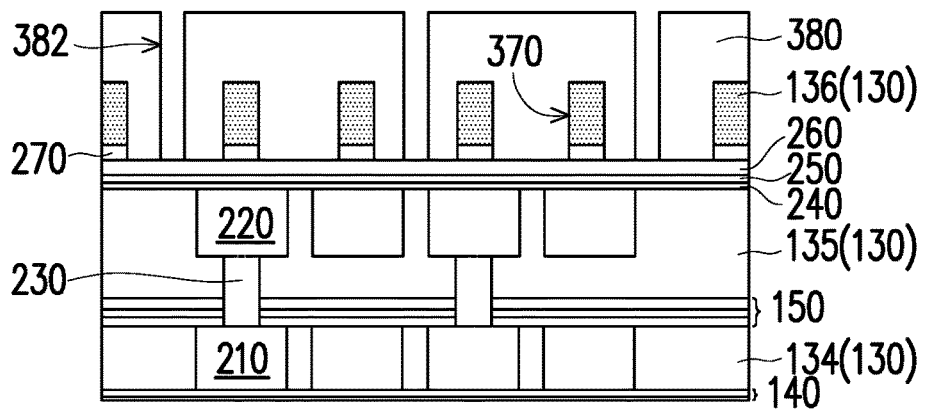
Figure 5H:
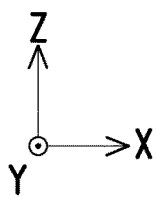
Figure 5H:
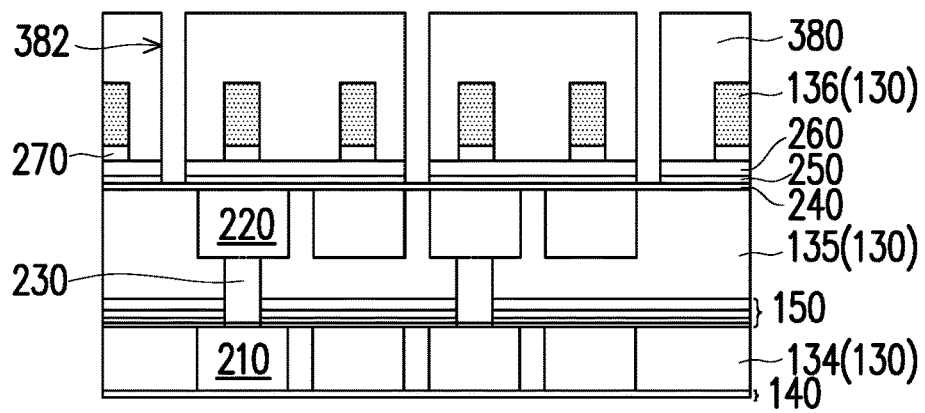

In FIG. 5F, a resist mask 380 is formed filling the contact trench 370 and further covering the interlayer dielectric layer 136. That is, the resist mask 380 may be formed of a thickness larger than the depth of the contact trench 370. In some embodiments, the resist mask 380 is a composite structure, including a bottom anti-reflective coating layer and a resist material disposed on the bottom anti-reflective coating layer. In some embodiments, the resist mask 380 includes a photoactive material. In some embodiments, the photoactive material is a positive photoresist. In some embodiments, the photoactive material is a negative photoresist. Referring to FIG. 5G, in some embodiments, the resist mask 380 is patterned to include spacer openings 382 exposing at their bottom the cap layer 260. In some embodiments, the spacer openings 382 form a reticulate structure within the contact trench 370, with openings extending along the X direction intersecting openings extending along the Y direction. Pairs of portions 1361 of interlayer dielectric layer 136 may remain within the meshes of the reticulate structure of the spacer openings 382, for example one pair per mesh. In some embodiments, the spacer openings 382 may be formed by exposure and development of the resist mask 380. In FIG. 5H, the spacer openings 382 are further extended through the cap layer 260 and the semiconductor channel layer 250 so as to expose at their bottom the gate dielectric layer 240. In some embodiments, the spacer openings 382 may be extended through one or more etching steps. The etching may be any acceptable etch process, such as dry etching, plasma etching, ion beam etching (IBE), the like, or a combination thereof. In some embodiments, the etching may be anisotropic. In some embodiments, the spacer openings 382 may be further extended through the gate dielectric layer 240.

Figure 5I:
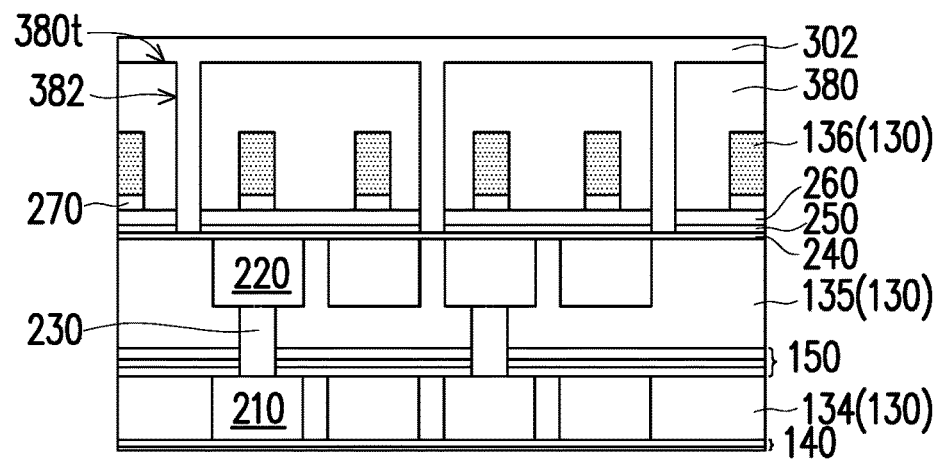
Figure 5J:
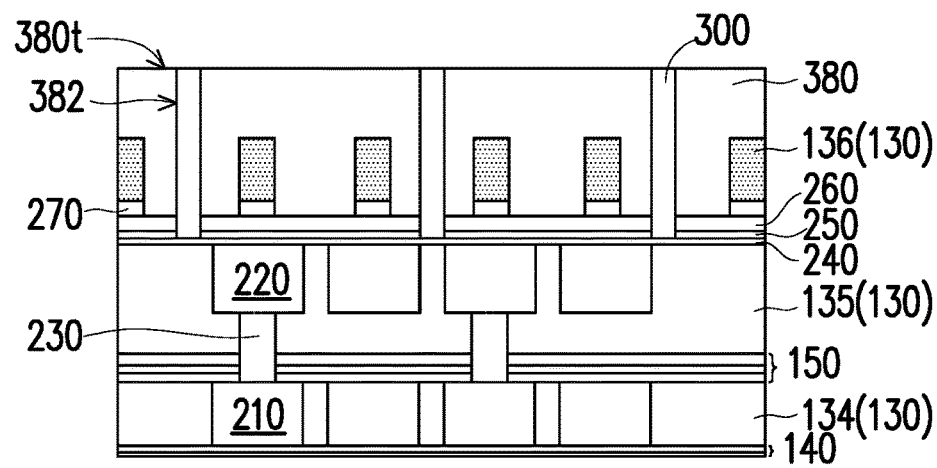

Referring to FIG. 5I, in some embodiments, a spacer material 302 is deposited within the spacer openings 382 and further on top of the resist mask 380. In some embodiments, the spacer material 302 fills the spacer openings and further extends on the top surface 380t of the resist mask 380. The spacer material 302 may be formed by any suitable process, such as ALD, PVD, CVD, or the like. Referring to FIG. 5I and FIG. 5J, the spacer material 302 may be etched back until the top surface 380t of the resist mask 380 is exposed, while the spacers 300 remains filling the spacer openings 382.

Figure 5K:
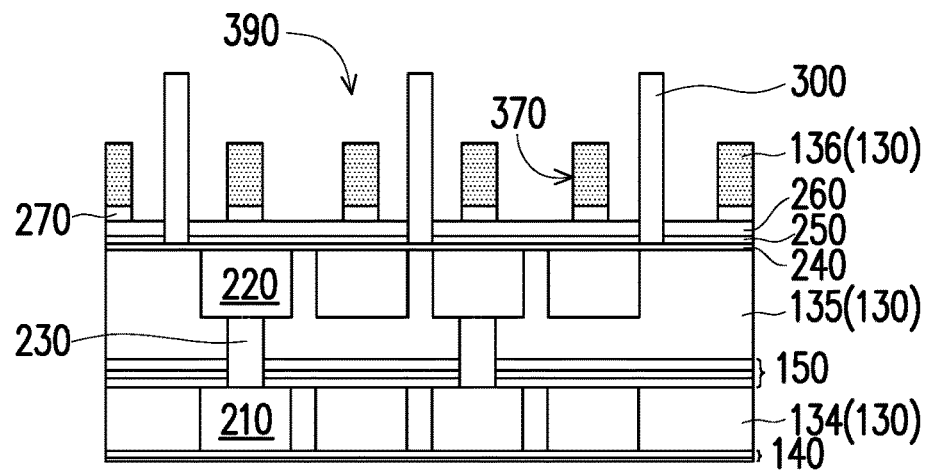

Referring to FIG. 5J and FIG. 5K, in some embodiments, the resist mask 380 is removed, for example via ashing or stripping, so that the cap layer 260 at the bottom of the contact trench 370 is once again exposed. Upon removal of the resist mask 380, a network (e.g., a meshed structure) formed by the spacers 300 remains in the contact trench 370, dividing the contact trench 370 in a plurality of regions 390 in which pairs of unit cells 202, 204 sharing a same drain contact 290 (as illustrated in FIG. 4A, for example) are subsequently formed, as further discussed in the following.

The regions 390 may correspond to the meshes of the reticulum formed by the spacers 300.

Figure 5L:
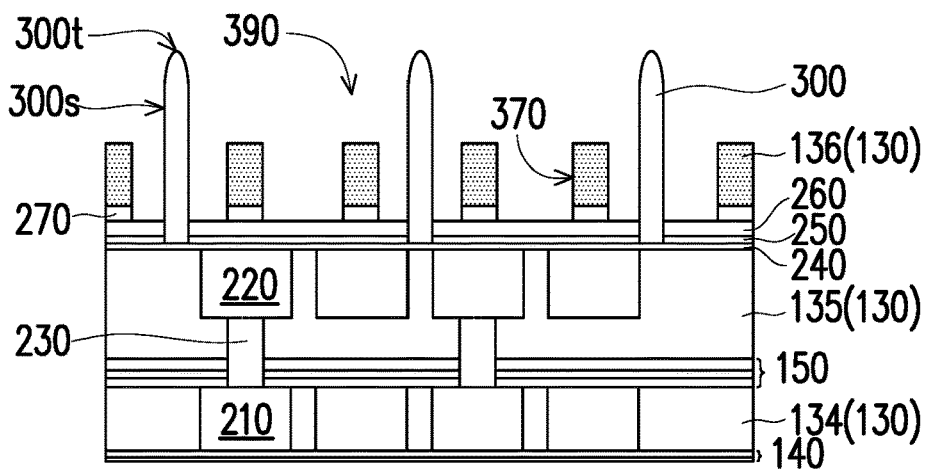

Referring to FIG. 5L, an isotropic etching step may be performed to round the corners of the spacers 300. For example, the isotropic etching may be dry etching, such as plasma etching. In some embodiments, following the etching step, the spacers 300 may present rounded tips 300t as well as concavities where the sidewalls 300s of the spacers 300 are exposed within the contact trench 370. On the other hand, in regions where the spacers 300 contacts the portions of interlayer dielectric 136, the sidewalls 300s of the spacers 300 may be protected during the etching step, so that no material is removed. In some embodiments, rounding the corners of the spacers 300 may facilitate subsequent metal filling steps.

Figure 5M:
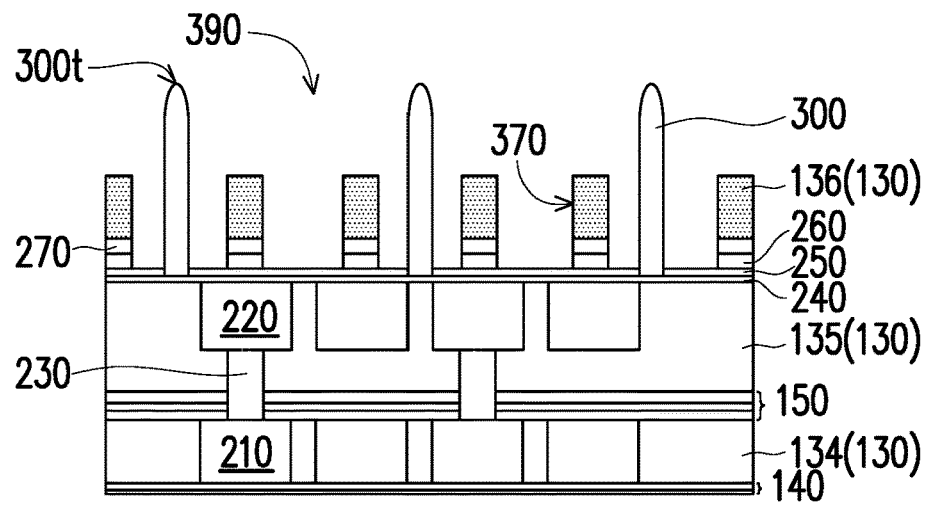

In FIG. 5M, the contact trench 370 is further extended through the cap layer 260 to expose the semiconductor channel layer 250 at its bottom. For example, an etching step may be performed to remove the portions of the cap layer 260 exposed at the bottom of the contact trench 370. The etching may be any suitable etching process, such as dry etching, plasma etching, ion beam etching (IBE), the like, or a combination thereof. In some embodiments, the etching may be anisotropic.

Figure 5N:
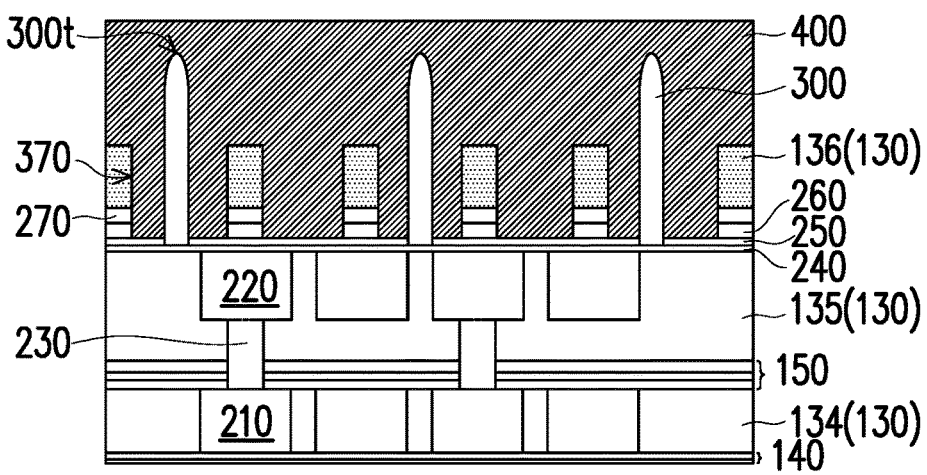

Referring to FIG. 5M and FIG. 5N, in some embodiments a metallic material 400 is disposed in the contact trench 370. For example, the metallic material 400 may be formed by deposition (e.g., CVD, PVD, ALD, etc.), plating, or the like. In some embodiments, the metallic material 400 fills the contact trench 370 and further buries the spacers 300. That is, the metallic material 400 may be formed of sufficient thickness to completely cover the tops 300t of the spacers 300 and extend on the interlayer dielectric layer 136. In some embodiments, the metallic material 400 occupies the concavities of the spacers 300 formed during the previous corner rounding step. That is, convexities of the metallic material 400 may be formed in correspondence of the concavities of the spacers 300.

Figure 5O:
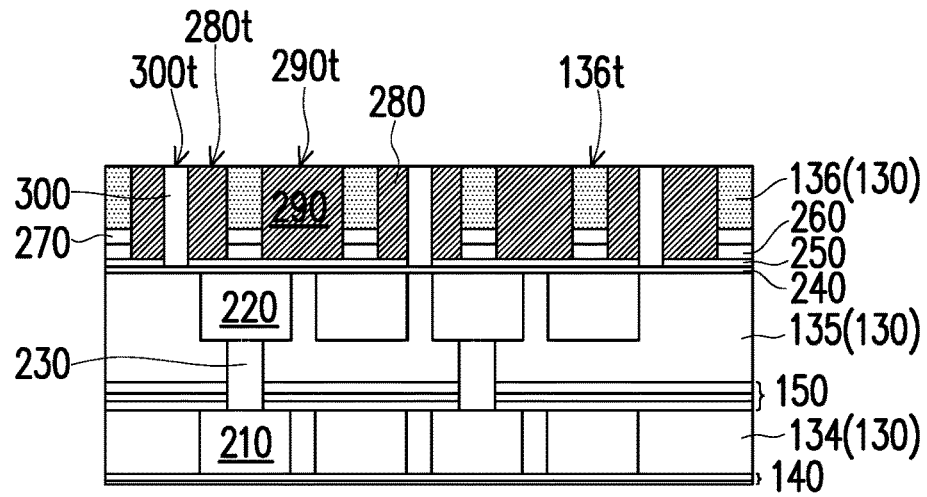
Figure 5P:
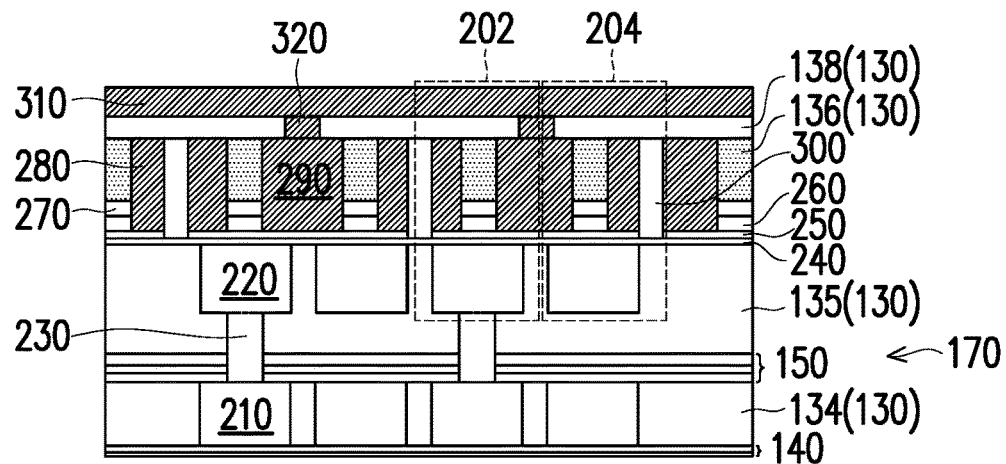

Referring to FIG. 5N and FIG. 5O, in some embodiments, a planarization process (e.g., grinding, chemical mechanical polishing, or the like) may be performed to remove portions of the metallic material 400 and the spacers 300 until the top surface 136t of the interlayer dielectric layer 136 is exposed. After planarization, the source contacts 280, the drain contacts 290, and the spacers 300 remain filling the contact trench 370, with corresponding top surfaces 280t, 290t, 300t substantially coplanar with the top surface 136t of the interlayer dielectric layer 136. In FIG. 5P, the interlayer dielectric layer 138 is formed over the planarized top surfaces 136t, 280t, 290t, 300t. The conductive lines 310 may then be formed embedded in the interlayer dielectric layer 136, with the contact vias 320 connecting the conductive lines 310 to the associated drain contacts 290. In some embodiments, the structure of FIG. 1 may be obtained from the structure of FIG. 5P by forming additional interlayer dielectric layers (e.g., the interlayer dielectric layer 139) and metallization layers 182, 184, as well as the passivation layer 190 and the contact pads 186.

As illustrated in FIG. 5A to FIG. 5P, in some embodiments, the spacers 300 are formed within the spacer openings 382 of a resist mask 380 before the source contacts 280 and the drain contacts 290 are formed. By doing so, the shapes and positions of the source contacts 280 and the drain contacts 290 are defined by the final spacers 300, rather than by dummy spacers which are then substituted with the final spacers. That is, in the process illustrated above, the use of dummy spacers and the processes involved in the replacement of the dummy spacers with the final spacers may be avoided. Therefore, the manufacturing process may be simplified and the production costs reduced, for example by reducing the number of masks required to define the positions of the source contacts 280, the drain contacts 290, and the spacers 300. In some embodiments, the simplification of the process may reduce the production costs as well as the variability of the manufactured structures, increasing the process reliability and reproducibility, even for high-density structures.

Figure 6:
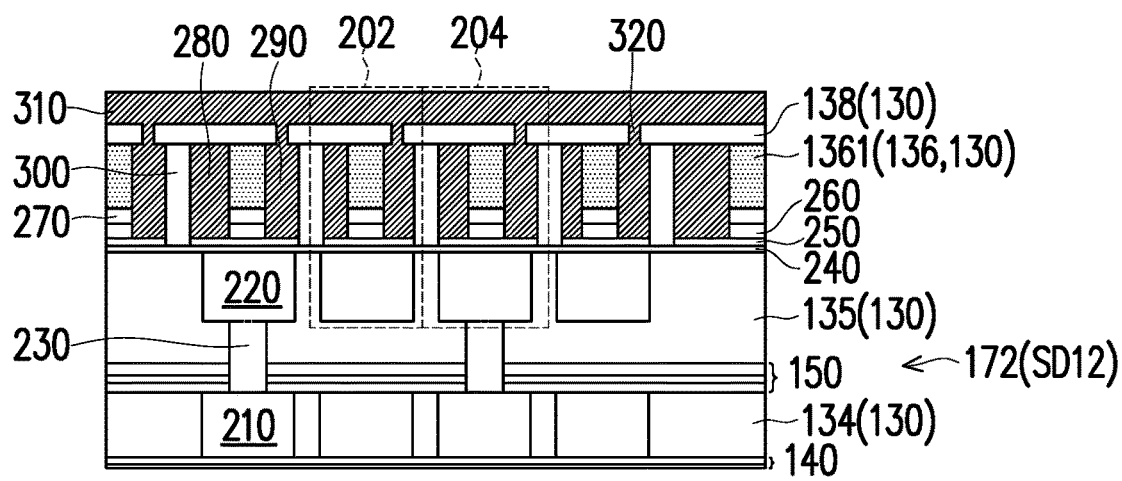
FIG. 6 is a schematic cross-sectional view of a region of a semiconductor device according to some embodiments of the disclosure.
Figure 7A:
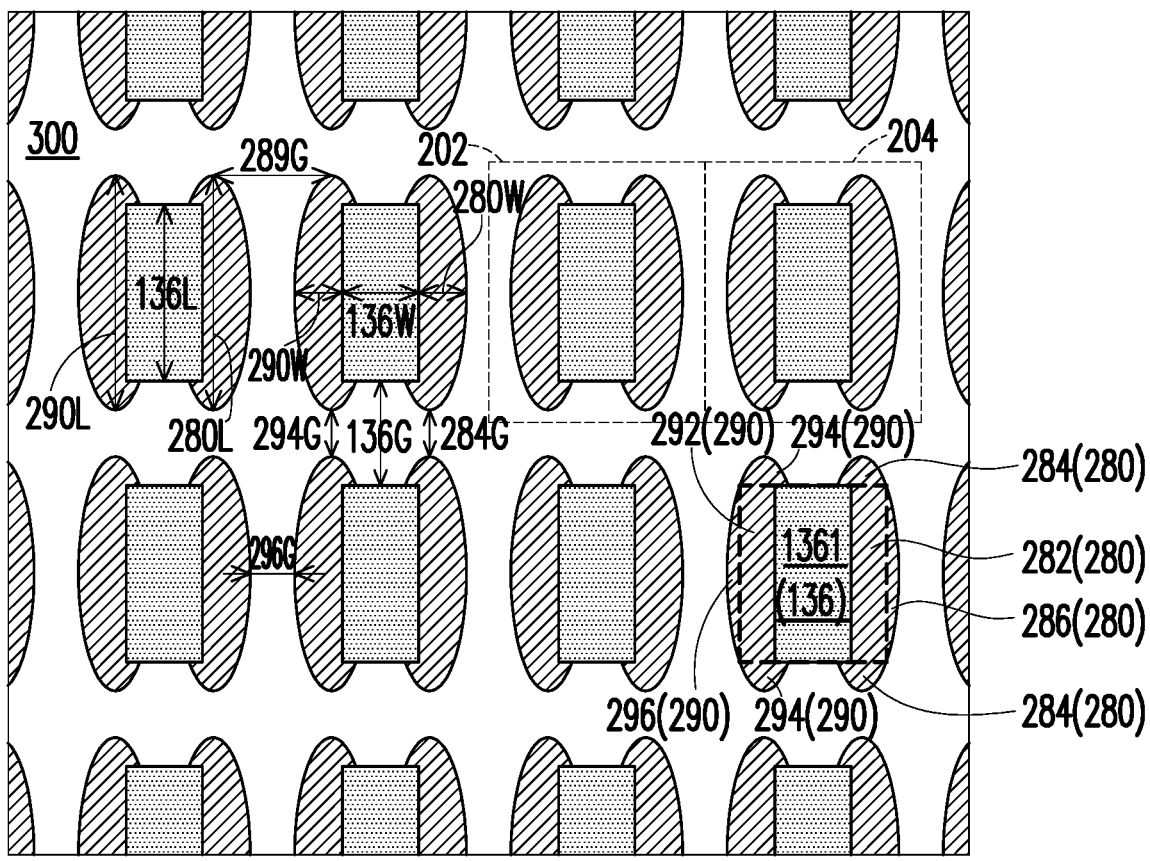
FIG. 7A is a schematic cross-sectional view of a region of a semiconductor device according to some embodiments of the disclosure.
Figure 7B:
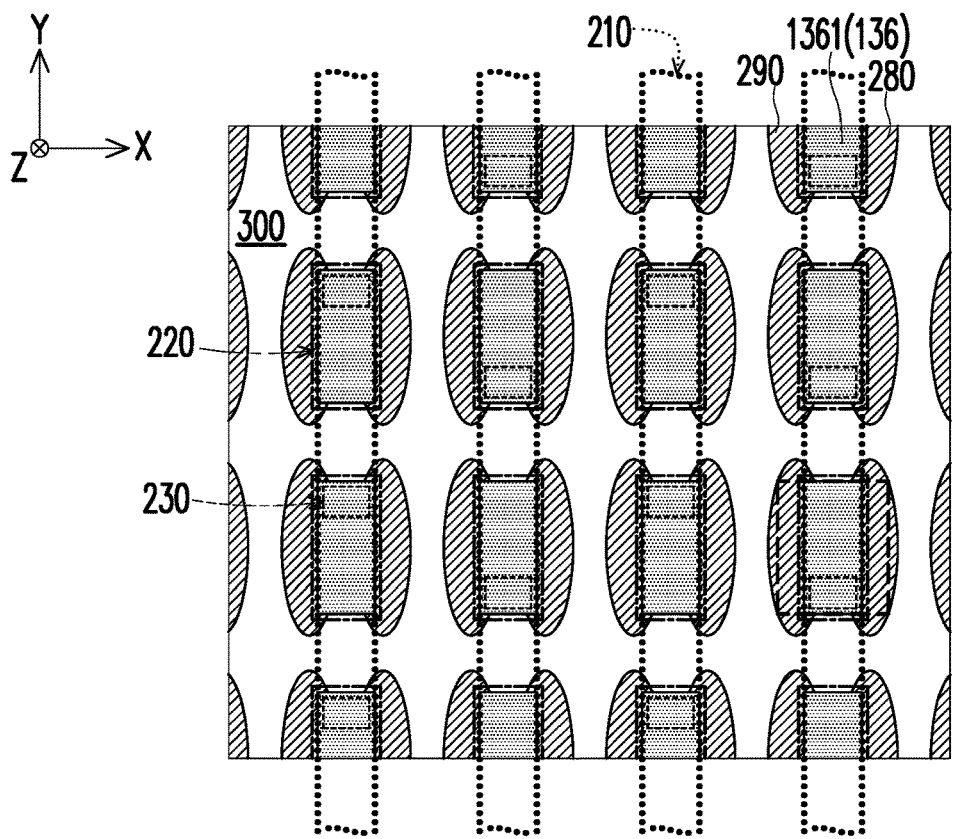
FIG. 7B is a schematic bottom view of a region of a semiconductor device according to some embodiments of the disclosure.
Figure 7C:
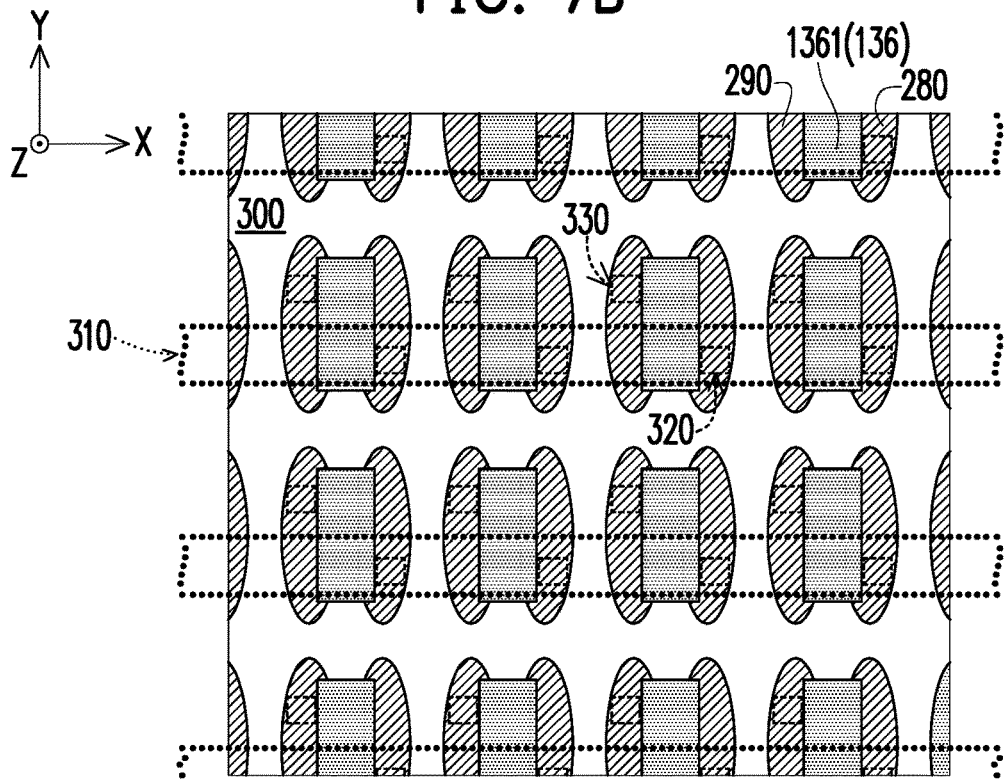
FIG. 7C is a schematic top view of a region of a semiconductor device according to some embodiments of the disclosure.

FIG. 6 is a schematic cross-sectional view of a region of a transistor array 172 of a semiconductor device SD12 according to some embodiments of the disclosure. The view of FIG. 6 may be taken in correspondence of a region as illustrated in FIG. 5P. FIG. 7A is a schematic cross-sectional view of a region of the transistor array 172 according to some embodiments of the disclosure. The view of FIG. 7A is taken in correspondence of the region illustrated in FIG. 4A. FIG. 7B is a schematic bottom view of the same region illustrated in FIG. 7A according to some embodiments of the disclosure. The view of FIG. 7B corresponds to the view of FIG. 7A, with added the footprints of some elements disposed along the negative Z direction with respect to the plane of view of FIG. 7A (e.g., moving towards the semiconductor substrate 100 illustrated in FIG. 1). FIG. 7C is a schematic top view of the same region illustrated in FIG. 7A according to some embodiments of the disclosure. The view of FIG. 7C corresponds to the view of FIG. 7A, with added the footprints of some elements disposed along the positive Z direction with respect to the plane of view of FIG. 7A (e.g., moving away from the semiconductor substrate 100 illustrated in FIG. 1).

In some embodiments, the semiconductor device SD12 may have a similar structure and may be manufactured according to similar processes as previously described for the semiconductor device SD10, and the corresponding description may be considered to equally apply, unless addressed in the following. A difference between the semiconductor device SD10 and the semiconductor device SD12 lies in that adjacent unit cells 202, 204 may not share a drain contact 290. Rather, the unit cells 202, 204 may have dedicated drain contacts 290 as well as source contacts 280 and gate patterns 220. The source contact 280 and the drain contact 290 of a given cell 202 or 204 may be separated by portions 1361 of the interlayer dielectric layer 136, and separated by the source contacts 280, drain contacts 290, and portions 1361 of the interlayer dielectric layer 136 of the other unit cells 202, 204 by the spacers 300.

In some embodiments, the portions 1361 of interlayer dielectric layer 136 may have similar shapes and sizes 136L, 136W as previously described for the semiconductor device SD10. Similarly, the source contacts 280 may have similar shapes and sizes 280L, 280W as previously described for the semiconductor device SD10. That is, the source contacts 280 may include core regions 282 and convexities 284 and 286 protruding into the spacers 300 along the Y direction and the X direction, respectively. In some embodiments, the drain contacts 290 also includes core regions 292 and convexities 294 protruding into the spacers along the Y direction, similar to the semiconductor device SD10. Furthermore, the drain contacts 290 may include convexities 296 protruding from the core regions 292 into the spacers 300 along the X direction, at an opposite side of the core regions 292 with respect to the adjacent portions 1361 of the interlayer dielectric layer 136. In some embodiments, the size 290W of the drain contacts 290 along the X direction may be about in the range from 10 angstroms to 100 angstroms.

In some embodiments, the spacers 300 still presents region of varying thickness according to whether the spacers 300 are in contact with the interlayer dielectric layer 136 or the source contacts 280 or the drain contacts 290. For example, the spacers 300 may be thicker in correspondence of regions contacting the interlayer dielectric layer 136, and thinner in correspondence of regions contacting the source contacts 280 or the drain contacts 290. For example, the spacers 300 may have thickness along the Y direction corresponding to the gaps 136G, 284G, and 294G respectively located between facing portions of interlayer dielectric layer 136, convexities 284 of the source contacts 280, and convexities 294 of the drain contacts 290 in the same ranges as previously described for the semiconductor device SD10. Furthermore, the spacers 300 may have a thickness in correspondence to the gaps 289G between the peaks of the convexities 284 and 294 of facing source contacts 280 and drain contacts 290 belonging to adjacent unit cells 202, 204 which is larger than a thickness in correspondence to the gaps 296G between the peaks of the convexities 286 and 296 of the same source contacts 280 and drain contacts 290. For example, the gaps 289G may be about in the range from 5.5 angstroms to 10000 angstroms, and the gaps 296G may be about in the range from 5 to 1000 angstroms. In some embodiments, the ratio of the thicknesses of the spacers 300 in correspondence of the gaps 289G to the gaps 296G may be about in the range from 1.1 to 2000.

In some embodiments, the contact vias 230 connecting the gate patterns 220 to the conductive lines 210 are disposed at different level heights along the Y direction for unit cells 202, 204 consecutively disposed adjacent to each other with respect to the X direction. However, the disclosure is not limited thereto. In some embodiments, the contact vias 230 of unit cells 202, 204 consecutively disposed adjacent to each other with respect to the X direction at the same level height along the Y direction may be formed at the same level height along the Y direction. In some embodiments, the contact vias 330 contacting the source contacts 280 may be formed on a same side (e.g., along the positive Y direction) with respect to the conductive lines 310 contacting the associated drain contacts 290 for all unit cells 202, 204. However, the disclosure is not limited thereto. In some embodiments, the contact vias 330 of unit cells 202, 204 belonging to rows at different level heights along the Y direction may be formed at different sides (along the Y direction) with respect to the conductive lines 310. For examples, the contact vias 330 of a first row of unit cells 202, 204 located at a first level height along the Y direction may be formed at one side with respect to the associated conductive lines 310 (e.g., at the positive Y direction), while the contact vias 330 of a second row of unit cells 202, 204 adjacent to the first row and located at a second level height along the Y direction may be formed at an opposite side with respect to the associated conductive lines 310 (e.g., at the negative Y direction).

Figure 8:
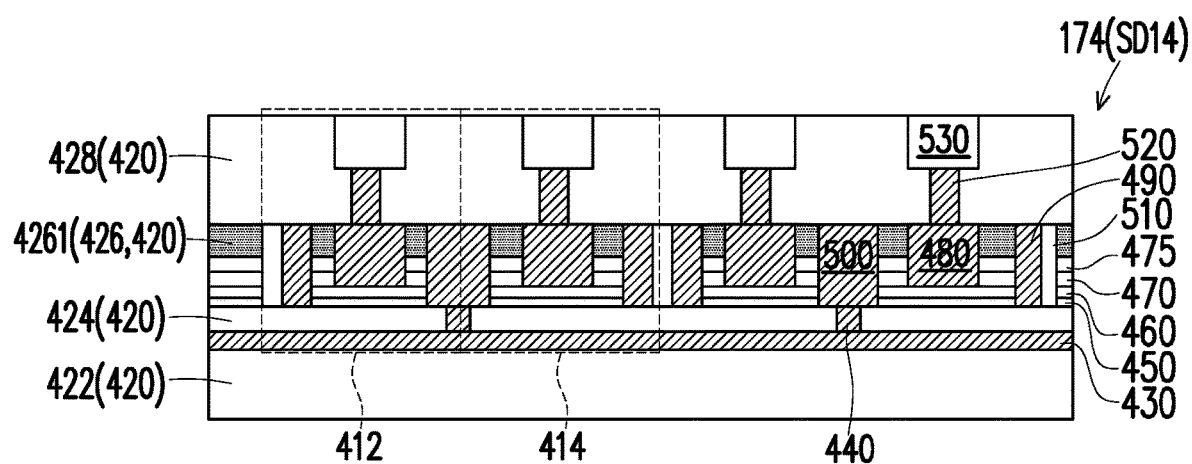
FIG. 8 is a schematic cross-sectional view of a region of a semiconductor device according to some embodiments of the disclosure.
Figure 9A:
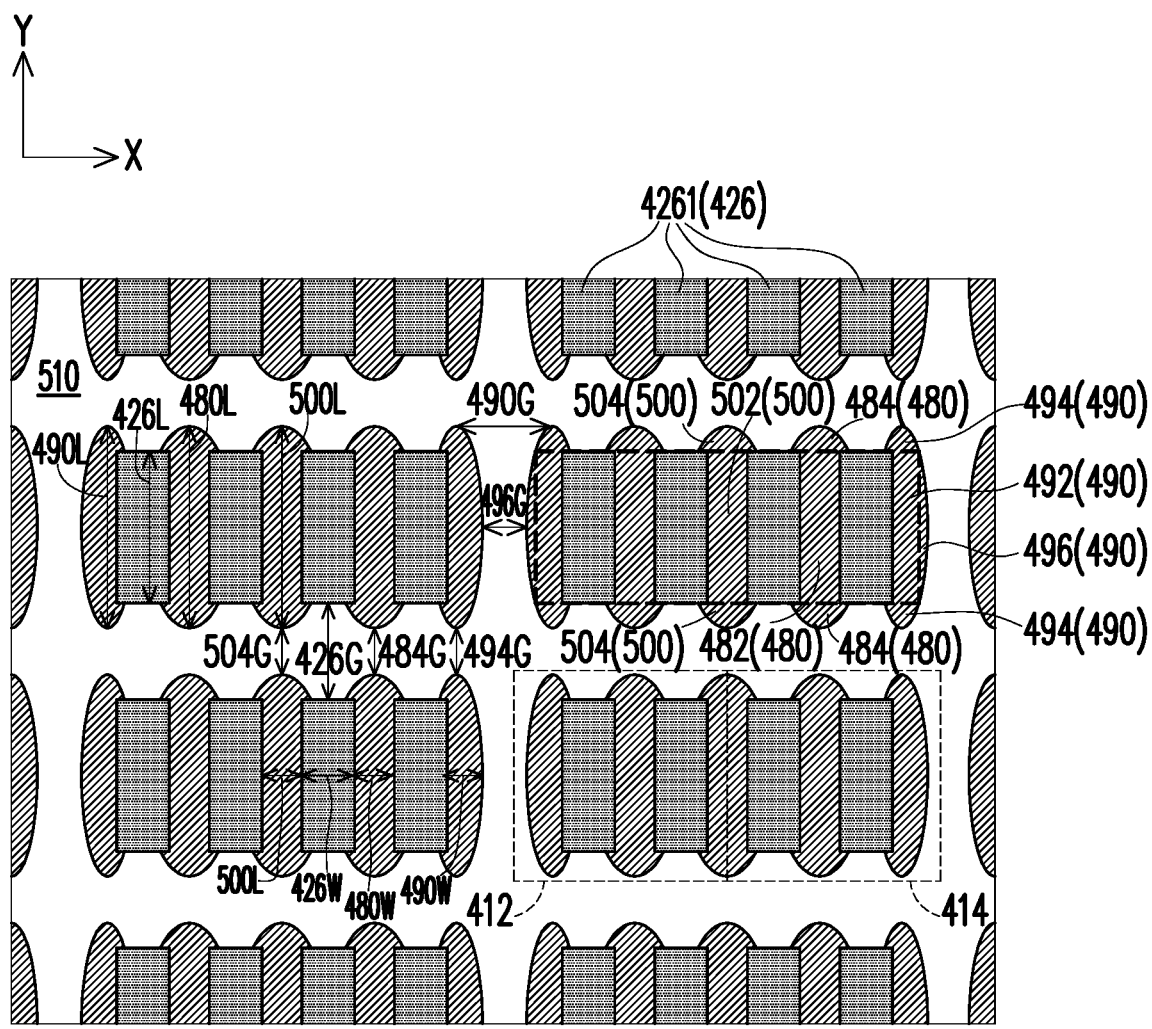
FIG. 9A is a schematic cross-sectional view of a region of a semiconductor device according to some embodiments of the disclosure.
Figure 9B:
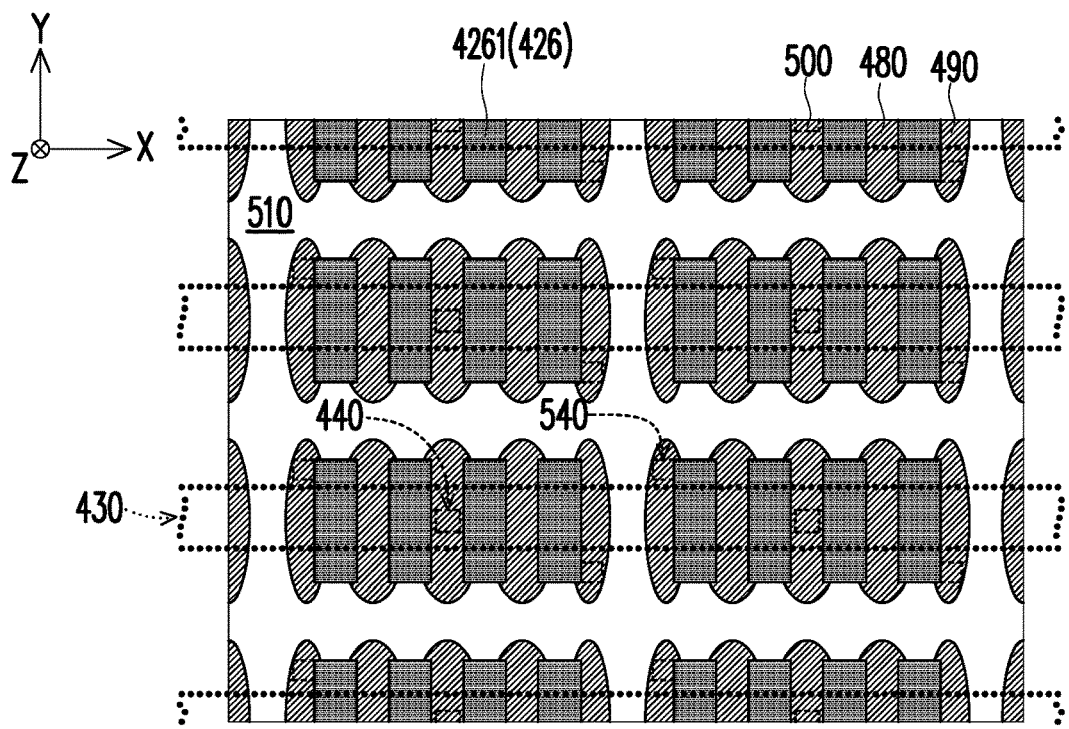
FIG. 9B is a schematic bottom view of a region of a semiconductor device according to some embodiments of the disclosure.
Figure 9C:
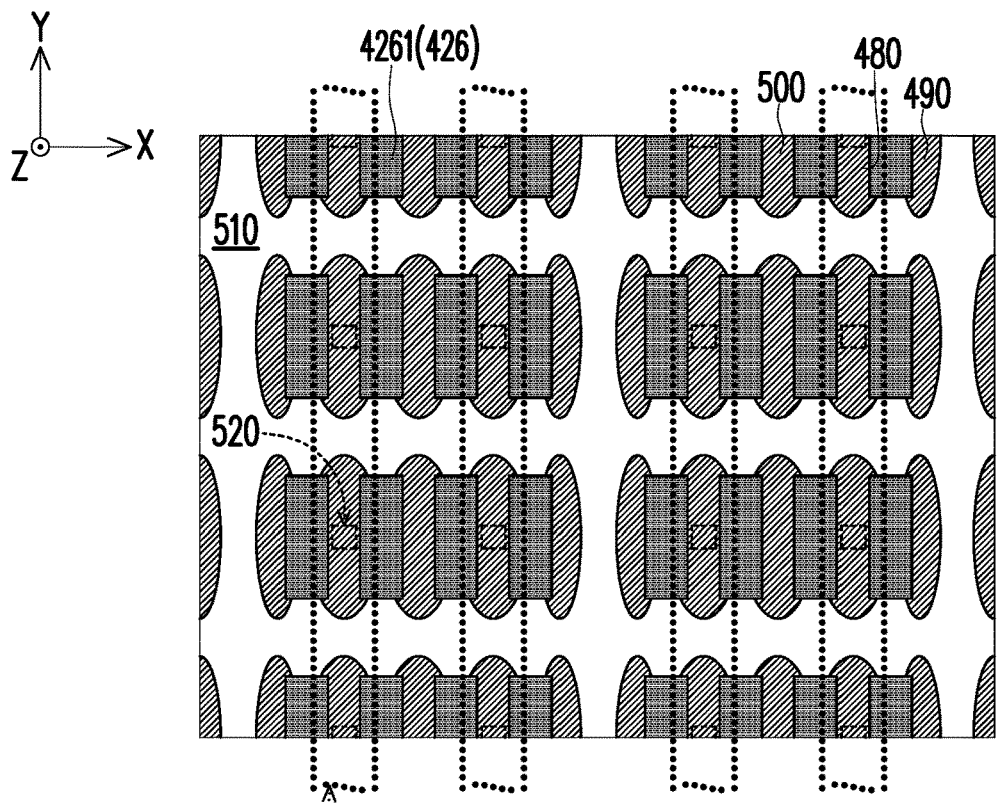
FIG. 9C is a schematic top view of a region of a semiconductor device according to some embodiments of the disclosure.

FIG. 8 is a schematic cross-sectional view of a region of a transistor array 174 of a semiconductor device SD14 according to some embodiments of the disclosure. The view of FIG. 8 may be taken in correspondence of a region as illustrated in FIG. 5P. FIG. 9A is a schematic cross-sectional view of a region of the transistor array 174 according to some embodiments of the disclosure. The view of FIG. 9A is taken in correspondence of a region as illustrated in FIG. 4A. FIG. 9B is a schematic bottom view of the same region illustrated in FIG. 9A according to some embodiments of the disclosure. The view of FIG. 9B corresponds to the view of FIG. 9A, with added the footprints of some elements disposed along the negative Z direction with respect to the plane of view of FIG. 9A (e.g., moving towards the semiconductor substrate 100 illustrated in FIG. 1). FIG. 9C is a schematic top view of the same region illustrated in FIG. 9A according to some embodiments of the disclosure. The view of FIG. 9C corresponds to the view of FIG. 9A, with added the footprints of some elements disposed along the positive Z direction with respect to the plane of view of FIG. 9A (e.g., moving away from the semiconductor substrate 100 illustrated in FIG. 1).

In some embodiments, the semiconductor device SD14 may have a similar structure and may be manufactured according to similar processes as previously described for the semiconductor device SD10, and all the corresponding description may be considered to equally apply, unless addressed in the following. So, for example, the transistor array 174 may include plural unit cells 412, 414 disposed in an array configuration, arranged along intersecting rows and columns. Parallel conductive lines 430 extending along the X direction may be embedded in an interlayer dielectric layer 422 of an interlayer dielectric 420 and may be connected by contact vias 440 to the unit cells 412, 414. Unit cells 412, 414 located at a same level height along the Y direction may be connected to a same conductive line 430. The unit cells 412, 414 may include stacked semiconductor channel layers 450, gate dielectric layers 460, cap layer 470, and hard mask layers 475, which may be all formed with similar materials as previously described. The semiconductor channel layers 450 may be separated from the conductive lines 430 by the interlayer dielectric layer 424. A difference between the semiconductor device SD14 and the semiconductor device SD10 lies in that the gate patterns 480 which control current flows in the unit cells 412, 414 are stacked on the gate dielectric layer 460 in between the source contacts 490 and the drain contacts 500. That is, the gate patterns 480 may be formed in the same interlayer dielectric layer 426 as the source contacts 490 and the drain contacts 500. In some embodiments, the gate patterns 480 land on the gate dielectric layer 460, while the source contacts 490 and the drain contacts 500 may extend through the gate dielectric layer 460 and, possibly, through the semiconductor channel layer 450 to land on the interlayer dielectric layer 424.

In some embodiments, the conductive lines 430 contacting the drain contacts 500 may be located closer to the semiconductor substrate 100 (illustrated, e.g., in FIG. 1) than the gate patterns 480, while the conductive lines 530 which control the gate patterns 480 may be located at an opposite side of the gate patterns 480 with respect to the semiconductor substrate 100 (and, for example, the conductive lines 430). For example, the conductive lines 530 may extend along the Y direction, with individual conductive lines 530 contacting the gate patterns 480 of unit cells 412, 414 located at a same level height along the X direction. The conductive lines 530 may be embedded in the interlayer dielectric layer 428 which extends on the interlayer dielectric layer 426, the gate patterns 480, the source contacts 490, the drain contacts 500, and the spacers 510. Contact vias 520 may connect the conductive lines 530 to the associated gate patterns 480.

In some embodiments, pairs of unit cells 412, 414 may share a drain contact 500, and be surrounded by the spacers 510. So, for example, two gate patterns 480 may be disposed at opposite sides along the X direction of a common drain contact 500, being separated from the drain contact 500 by portions 4261 of the interlayer dielectric layer 426, and two source contacts 480 may be disposed at opposite sides of the gate patterns 480 with respect to the drain contact 500, being separated from the gate patterns 480 by portions 4261 of the interlayer dielectric layer 426. In some embodiments, the portions 4261 of the interlayer dielectric layer 426 interposed between the gate patterns 480, the source contacts 490, and the drain contacts 500 may have similar shapes and sizes 462L, 462W as previously described for the portions 4261 of interlayer dielectric layer 136 of the semiconductor device SD10 (illustrated, e.g., in FIG. 4A). Similarly, the source contacts 490 may have similar shapes and sizes 490L, 490W as previously described for the source contacts 280 of the semiconductor device SD10. That is, the source contacts 490 may include core regions 492 and convexities 494 and 496 protruding into the spacers 510 along the Y direction and the X direction, respectively. In some embodiments, the drain contacts 500 and the gate patterns 480 also include core regions (502 and 482, respectively) and convexities (504 and 484, respectively) protruding into the spacers along the Y direction, similar to the drain contacts 290 of the semiconductor device SD10. In some embodiments, the size 480L of the gate pattern 480 along the Y direction may be about in the range from 10 angstroms to 300 angstroms, and the size 480W of the gate patterns 480 along the X direction may be about in the range from 10 angstroms to 200 angstroms. Similarly, the size 500L of the drain contacts 500 along the Y direction may be about in the range from 10 angstroms to 300 angstroms, and the size 500W of the drain contacts 500 along the X direction may be about in the range from 10 angstroms to 200 angstroms.

In some embodiments, the spacers 510 still presents region of varying thickness according to whether the spacers 510 are in contact with the interlayer dielectric layer 426, the gate patterns 480, the source contacts 490, or the drain contacts 500. For example, the spacers 510 may be thicker in correspondence of regions contacting the interlayer dielectric layer 426, and thinner in correspondence of regions contacting the gate patterns 480, the source contacts 490, or the drain contacts 500. For example, the spacers 510 may have thickness along the Y direction corresponding to the gaps 426G, 484G, 494G, and 504G respectively located between facing portions of interlayer dielectric layers 426, convexities 484 of the gate patterns 480, convexities 494 of the source contacts 490, and convexities 504 of the drain contacts 500. In same embodiments, the gaps 426G, 494G, 504G may be in the same ranges and ratios as previously described for the gaps 136G, 284G, 294G of the semiconductor device SD10. The gap 484G may be about in the range from 5 angstrom to 1000 angstroms. In some embodiments, a ratio of the gap 484G to the gap 426G may be about in a range from 0.5 to 1. Furthermore, the spacers 510 may have a thickness in correspondence to the gaps 490G between the peaks of the convexities 494 of source contacts 480 belonging to adjacent unit cells 412, 414 which do not share a same drain contact 500 which is larger than a thickness in correspondence to the gaps 496G between the peaks of the convexities 496 of the same source contacts 490. For example, the gaps 490G may be in the range from 5.5 angstroms to 10000 angstroms, and the gaps 496G may be about in the range from 5 angstroms to 1000 angstroms. In some embodiments, the ratio of the thicknesses of the spacers 510 in correspondence of the gaps 490G to the gaps 496G may be about in the range from 1.1 to 2000.

In some embodiments, the contact vias 520 connecting the gate patterns 480 to the conductive lines 530 may be disposed at the same level heights along the Y direction for unit cells 412, 414 consecutively disposed adjacent to each other with respect to the X direction at a same level height along the Y direction, whether or not such unit cells 412, 414 share a same drain contact 500. However, the disclosure is not limited thereto. In some embodiments, the contact vias 520 of unit cells 412, 414 consecutively disposed adjacent to each other with respect to the X direction may be formed at different level heights along the Y direction. In some embodiments, the contact vias 520 connecting the gate patterns 480 to the conductive lines 530 may land in correspondence of the core regions 482, however the disclosure is not limited thereto. In some alternative embodiments, the contact vias 520 may land in correspondence of the convexities 484. In some embodiments, the contact vias 440 connecting the drain contacts 500 to the conductive lines 430 may land in correspondence of the core regions 502, while the contact vias 540 connected to the source contacts 490 may land on the convexities 494. For example, for a pair of unit cells 412, 414 sharing the same drain contact 500, the contact vias 540 contacting the source contacts 490 may be disposed at opposite sides of the conductive line 430 along the Y direction. However, the disclosure is not limited thereto, and other configurations are possible. For example, the conductive lines 430 may overlay the convexities 504, so that the contact vias 440 land on the convexities 504, while one or both of the contact vias 540 land on the core regions 492.

Figure 10:
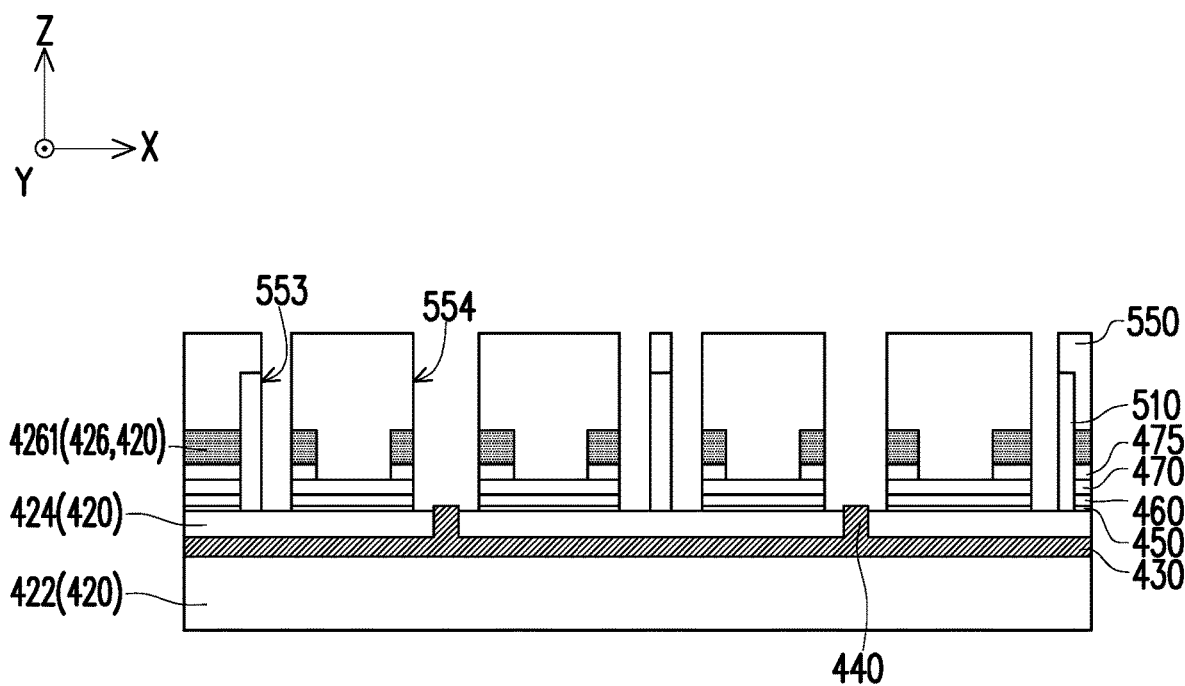
FIG. 10 is a schematic cross-sectional view of a region of a structure formed during a manufacturing method of a semiconductor device according to some embodiments of the disclosure.

In some embodiments, the semiconductor device SD14 may be manufactured following substantially the same process as previously described with respect to the semiconductor device SD10 in FIG. 5A to FIG. 5P. Referring to FIG. 10, in some embodiments, the spacers 510 may be formed so as to extend through the semiconductor channel layer 450. Furthermore, before the metallic material of the gate patterns 480, the source contacts 490, and the drain contacts 500 is disposed (e.g., at a step corresponding to FIG. 5K in the process previously described), an additional resist mask 550 may be provided including contact openings 553, 554 which are used to remove further portions of the semiconductor channel layer 450 and the gate dielectric layer 460 beside the spacers 510 and in correspondence of the contact vias 440, thus defining the position of the source contacts 490 and the drain contacts 500. For example, the contact openings 554 may expose at their bottom the contact vias 440, thus defining the location of the drain contacts 500, while the contact openings 553 may expose at their bottom the contact vias 540. In some embodiments, the additional resist mask 550 may be formed anew after the resist mask used to define the spacers 510 is removed (e.g., the resist mask 380 in FIG. 5G). Alternatively, the additional resist mask 550 may be formed from the resist mask used to define the spacers 510 after the spacer material is removed from the top of the resist mask, for example via additional exposure and development. Upon removal of the resist mask 550, process steps similar to the ones previously described with reference to FIG. 5L to FIG. 5P may be performed to form the semiconductor device SD14.

It should be noted that the features previously described may also be implemented in the structure of the semiconductor device SD14. For example, adjacent unit cells 412, 414 are not limited to share a common drain contact 500, and, in some embodiments, the unit cells 412, 414 may have dedicated individual drain contacts 500, as previously discussed for the semiconductor device SD12 with reference to FIG. 7A. Consequently, the drain contacts 500 may also include convexities along the X direction, other than the convexities 504 along the Y direction as illustrated in FIG. 9A.

In accordance with some embodiments of the disclosure, a semiconductor die includes a semiconductor substrate and a transistor array disposed over the semiconductor substrate. The transistor array includes unit cells and spacers. The unit cells are disposed along rows of the transistor array extending in a first direction and columns of the transistor array extending in a second direction perpendicular to the first direction. The spacers encircle the unit cells. The unit cells include source contacts and drain contacts separated by interlayer dielectric material portions. First sections of the spacers contacting the interlayer dielectric material portions are thicker than second sections of the spacers contacting the source contacts and the drain contacts.

In accordance with some embodiments of the disclosure, a semiconductor device includes a semiconductor substrate, an interlayer dielectric, transistors, and spacers. The interlayer dielectric is disposed on the semiconductor substrate and includes a first interlayer dielectric layer. The transistors are embedded in the interlayer dielectric and are arranged in an array of rows and columns. The spacers separate adjacent transistors of the transistors. The transistor includes semiconductor channel layers, source contacts, drain contacts, and gate patterns. The semiconductor channel layers extend along a first direction. The first direction is an extending direction of the rows of the array. The source contacts contact first ends of the semiconductor channel layers. The drain contacts contact second ends of the semiconductor channel layers. The gate patterns overlap middle sections of the semiconductor channel layers. The middle sections join the first ends to the corresponding second ends. The source contacts are separated from the drain contacts by portions of a first interlayer dielectric layer of the interlayer dielectric layers. The source contacts and the drain contacts both comprise core regions and first convexities protruding from the core regions into the spacers.

In accordance with some embodiments of the disclosure, a manufacturing method of a semiconductor device includes the following steps. A semiconductor channel layer is formed over a first interlayer dielectric layer. A second interlayer dielectric layer is formed over the semiconductor channel layer. The second interlayer dielectric layer is patterned to form isolated portions and form a contact trench. The isolated portions of the second interlayer dielectric layer remains in the contact trench. A patterned resist mask is formed in the contact trench and on the second interlayer dielectric layer. The patterned resist mask includes a reticulate opening formed within the contact trench. The reticulate opening is filled with spacer material. The patterned resist mask and spacer material are removed to form spacers with meshes within the contact trench. The isolated portions of the second interlayer dielectric layer are located within the meshes of the spacers. The meshes of the spacers in the contact trench are filled with metallic material to form source contacts and drain contacts. The source contacts and the drain contacts contact the semiconductor channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die, comprising:
a semiconductor substrate and a transistor array disposed over the semiconductor substrate, wherein the transistor array comprises:
unit cells disposed along rows of the transistor array extending in a first direction and columns of the transistor array extending in a second direction perpendicular to the first direction; and
spacers, encircling the unit cells,
wherein the unit cells comprise source contacts and drain contacts separated by interlayer dielectric material portions, and
wherein the source contacts and the drain contacts both comprise core regions and convexities protruding from the core regions into the spacers.

2. The semiconductor die of claim 1, wherein first sections of the spacers contacting the interlayer dielectric material portions are up to twice as thick as second sections of the spacers contacting the source contacts and the drain contacts.

3. The semiconductor die of claim 1, wherein the unit cells include pairs of adjacent unit cells sharing a same drain contact and each pair of the pairs of adjacent unit cells is disposed in a corresponding mesh of the spacers.

4. The semiconductor die of claim 1, wherein the unit cells are individually encircled by corresponding meshes of the spacers.

5. The semiconductor die of claim 1, wherein the unit cells further comprise:
semiconductor channel layers, extending from the source contacts to the drain contacts along the first direction; and
gate patterns, overlapping sections of the semiconductor channel layers extending between the source contacts and the drain contacts.

6. The semiconductor die of claim 5, wherein the gate patterns are located at an opposite side of the semiconductor channel layers with respect to the source contacts and the drain contacts.

7. The semiconductor die of claim 5, wherein the transistor array further comprises:
first conductive lines extending along the first direction and contacting the drain contacts of unit cells belonging to a same row of the array;
second conductive lines extending along the second direction and contacting the gate patterns of unit cells belonging to a same column of the array.

8. A semiconductor device, comprising:
a semiconductor substrate;
an interlayer dielectric disposed on the semiconductor substrate and comprising a first interlayer dielectric layer;
transistors, embedded in the interlayer dielectric and arranged in an array of rows and columns; and
spacers, separating adjacent transistors of the transistors,
wherein the transistors comprise:
semiconductor channel layers, extending along a first direction, the first direction being an extending direction of the rows of the array;
source contacts, contacting first ends of the semiconductor channel layers;
drain contacts, contacting second ends of the semiconductor channel layers; and
gate patterns, overlapping middle sections of the semiconductor channel layers, the middle sections joining the first ends to the corresponding second ends, wherein the source contacts are separated from the drain contacts by portions of the first interlayer dielectric layer, and the source contacts and the drain contacts both comprise core regions and first convexities protruding from the core regions into the spacers.

9. The semiconductor device of claim 8, wherein the drain contacts physically contact pairs of portions of the first interlayer dielectric layer at opposite sides of the core regions of the drain contacts along the first direction.

10. The semiconductor device of claim 8, wherein, in the transistors, the gate patterns are disposed between the corresponding source contacts and drain contacts and are separated from the source contacts and the drain contacts by the portions of the first interlayer dielectric layer, and wherein the gate patterns comprise core regions and second convexities protruding from the core regions into the spacers with respect to the portions of the interlayer dielectric.

11. The semiconductor device of claim 8, wherein the first convexities protrude into the spacers along a second direction with respect to the adjacent portions of the first interlayer dielectric layer, the second direction being an extending direction of the columns of the array, and the source contacts further comprise second convexities protruding from the core regions into the spacers along the first direction, at opposite sides of the core regions with respect to the adjacent portions of the first interlayer dielectric layer.

12. The semiconductor device of claim 11, wherein the drain contacts further comprise third convexities protruding from the core regions into the spacers along the first direction, at opposite sides of the core regions with respect to the adjacent portions of the first interlayer dielectric layer.

13. The semiconductor device of claim 12, wherein for a pair of the transistors consecutively arranged along a row of the array and separated by the spacers, a first distance between peaks of the first convexities of the source contact of one transistor of the pair and peaks of the first convexities of the drain contact of the other transistor of the pair is larger than a second distance between a peak of the second convexity of the source contact of the one transistor and a peak of the third convexity of the drain contact of the other transistor, the first distance and the second distance both being measured along the first direction.

14. The semiconductor device of claim 11, wherein for a pair of the transistors consecutively arranged along a row of the array and separated by the spacers, a first distance between peaks of the first convexities of the source contacts of the pair is larger than a second distance between peaks of the second convexities of the source contacts of the pair, the first distance and the second distance both being measured along the first direction.

15. A manufacturing method of a semiconductor device, comprising:

forming a semiconductor channel layer over a first interlayer dielectric layer;

forming a second interlayer dielectric layer over the semiconductor channel layer;

patterning the second interlayer dielectric layer to form isolated portions and form a contact trench, wherein the isolated portions of the second interlayer dielectric layer remain in the contact trench;

forming a patterned resist mask in the contact trench and on the second interlayer dielectric layer, wherein the patterned resist mask comprises a reticulate opening formed within the contact trench;

filling the reticulate opening with a spacer material;

removing the patterned resist mask and removing the spacer material to form spacers with meshes within the contact trench, wherein the isolated portions of the second interlayer dielectric layer are located within the meshes of the spacers; and filling the meshes of the spacers in the contact trench with a metallic material to form source contacts and drain contacts contacting the semiconductor channel layer.

16. The manufacturing method of claim 15, wherein forming the source contacts and drain contacts further comprises performing a planarization process on the metallic material and the spacers until the isolated portions of the second interlayer dielectric layer are exposed, and wherein the manufacturing method further comprises forming a third interlayer dielectric layer on the planarized spacers, source contacts, and drain contacts.

17. The manufacturing method of claim 15, further comprising rounding corners of the spacers before filling the meshes with the metallic material, wherein the spacer material is partially removed to form concavities in sections of the spacers not contacting the isolated portions of the second interlayer dielectric layer.

18. The manufacturing method of claim 15, further comprising:

removing portions of the semiconductor channel layer at a bottom of the reticulate opening to form isolated semiconductor channel layers, whereby the spacers encircle the isolated semiconductor channel layers.

19. The manufacturing method of claim 15, further comprising:

forming a cap layer on the semiconductor channel layer before forming the second interlayer dielectric layer; and removing portions of the cap layer exposed at a bottom of the contact trench after the spacers are formed and before filling the metallic material.

20. The manufacturing method of claim 15, further comprising:

forming gate patterns in the first interlayer dielectric layer; and forming a gate dielectric layer on the gate patterns and the first interlayer dielectric layer, wherein the semiconductor channel layer is formed on the gate dielectric layer, and the spacers contact the gate dielectric layer.

* * * * *